(12) United States Patent  (10) Patent No.: US 7,538,376 B2
Hashimoto et al.  (45) Date of Patent: May 26, 2009

(54) SEMICONDUCTOR INTEGRATED CIRCUIT DEVICE INCLUDING A SEMICONDUCTOR DEVICE HAVING A STABLE THRESHOLD CHARACTERISTIC

(75) Inventors: Hiroshi Hashimoto, Kawasaki (JP); Koji Takahashi, Kawasaki (JP)

(73) Assignee: Fujitsu Microelectronics Limited, Tokyo (JP)

( * ) Notice: Subject to any disclaimer, the term of this patent is extended or adjusted under 35 U.S.C. 154(b) by 0 days.

(21) Appl. No.: 10/083,533

(22) Filed: Feb. 27, 2002

(65) Prior Publication Data
US 2003/0008458 A1  Jan. 9, 2003

(30) Foreign Application Priority Data
Jul. 5, 2001 (JP) ............................. 2001-205188

(51) Int. Cl.
H01L 29/76 (2006.01)
(52) U.S. Cl. .................. 257/314; 257/315; 257/321; 257/410; 257/E29.3
(58) Field of Classification Search ......... 257/314–315, 257/316–326, 410; 438/257, 201, 212, 593, 438/258, 266, 264, 241
See application file for complete search history.

(56) References Cited

U.S. PATENT DOCUMENTS

| 5,404,037 | A | * | 4/1995 | Manley | 257/321 |
| 5,506,159 | A | * | 4/1996 | Enomoto | 438/258 |
| 5,517,443 | A | * | 5/1996 | Liu et al. | 365/51 |
| 5,841,174 | A |  | 11/1998 | Arai | 257/392 |
| 5,847,427 | A |  | 12/1998 | Hagiwara |  |
| 5,879,990 | A | * | 3/1999 | Dormans et al. | 438/257 |
| 5,911,105 | A |  | 6/1999 | Sasaki |  |
| 5,963,808 | A | * | 10/1999 | Lu et al. | 438/286 |
| 6,004,829 | A | * | 12/1999 | Chang et al. | 438/16 |

(Continued)

FOREIGN PATENT DOCUMENTS

JP  03-206661 A  9/1991

(Continued)

OTHER PUBLICATIONS

Chinese Office Action dated May 9, 2008, issued in corresponding Chinese Application No. 200710078922.4.

(Continued)

Primary Examiner—Wai-Sing Louie
(74) Attorney, Agent, or Firm—Westerman, Hattori, Daniels & Adrian, LLP.

(57) ABSTRACT

A semiconductor integrated circuit device includes a substrate, a nonvolatile memory device formed in a memory cell region of the substrate, and a semiconductor device formed in a device region of the substrate. The nonvolatile memory device has a multilayer gate electrode structure including a tunnel insulating film and a floating gate electrode formed thereon. The floating gate electrode has sidewall surfaces covered with a protection insulating film. The semiconductor device has a gate insulating film and a gate electrode formed thereon. A bird's beak structure is formed of a thermal oxide film at an interface of the tunnel insulating film and the floating gate electrode, the bird's beak structure penetrating into the floating gate electrode along the interface from the sidewall faces of the floating gate electrode, and the gate insulating film is interposed between the substrate and the gate electrode to have a substantially uniform thickness.

14 Claims, 35 Drawing Sheets

FLASH MEMORY CELL

U.S. PATENT DOCUMENTS

| | | | | |
|---|---|---|---|---|
| 6,027,971 | A * | 2/2000 | Cho et al. | 438/257 |
| 6,165,846 | A * | 12/2000 | Carns et al. | 438/264 |
| 6,180,457 | B1 * | 1/2001 | Shin et al. | 438/258 |
| 6,251,728 | B1 * | 6/2001 | Patelmo et al. | 438/257 |
| 6,274,430 | B1 * | 8/2001 | Jan et al. | 438/258 |
| 6,274,901 | B1 * | 8/2001 | Odake et al. | 257/315 |
| 6,294,430 | B1 * | 9/2001 | Fastow et al. | 438/264 |
| 6,362,049 | B1 * | 3/2002 | Cagnina et al. | 438/258 |
| 6,370,059 | B2 * | 4/2002 | Kato et al. | 365/185.11 |
| 6,406,959 | B2 * | 6/2002 | Prall et al. | 438/258 |
| 6,417,044 | B1 * | 7/2002 | Ono | 438/241 |
| 6,420,232 | B1 * | 7/2002 | Wu | 438/257 |
| 6,436,765 | B1 * | 8/2002 | Liou et al. | 438/259 |
| 6,544,845 | B2 * | 4/2003 | Yoo et al. | 438/257 |
| 2001/0025981 | A1 * | 10/2001 | Yoo et al. | 257/315 |
| 2001/0026982 | A1 * | 10/2001 | Doi et al. | 438/305 |
| 2001/0040822 | A1 * | 11/2001 | Kato et al. | 365/185.11 |
| 2003/0111695 | A1 * | 6/2003 | Kanamori | 257/384 |

FOREIGN PATENT DOCUMENTS

| | | |
|---|---|---|
| JP | 4-302174 | 10/1992 |
| JP | 9-298281 | 11/1997 |
| JP | 2001007227 | 1/2001 |
| JP | 2001156273 | 6/2001 |

OTHER PUBLICATIONS

International Business Machines, "A single-layer polysilicon EEPROM memory cell using diffusion gate"; Jan. 1, 1999; Research Disclosure, Mason Publications, Hampshire, GB, XP007123866; ISSN: 0374-4353.

European Search Report; European Patent Application No. EP 08105801.8-1235, dated Dec. 22, 2008.

Office Action, European Patent Application No. 02 290 504.6-1235; dated Jan. 26, 2009.

* cited by examiner

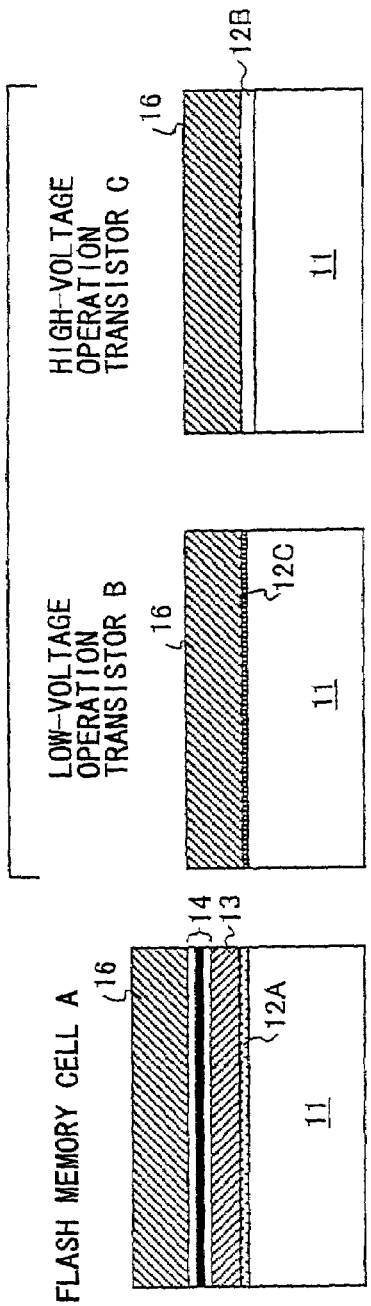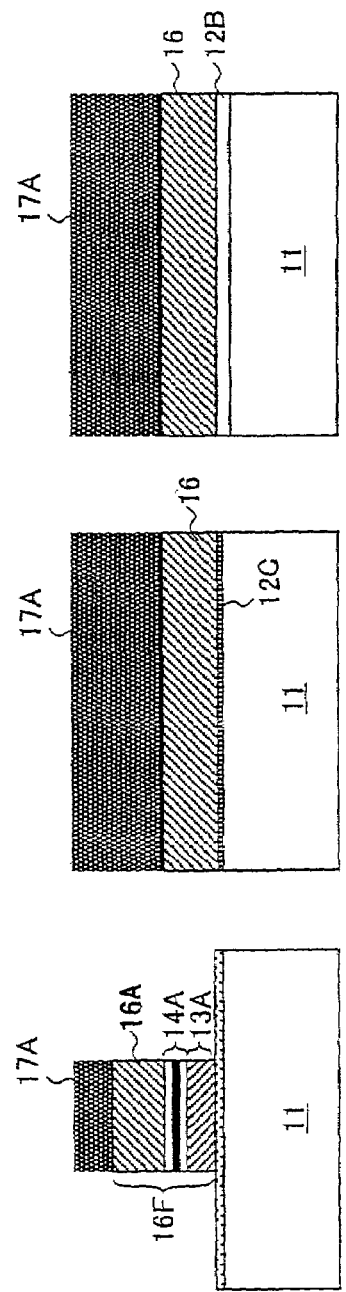
FIG. 1G PRIOR ART
FIG. 1H PRIOR ART

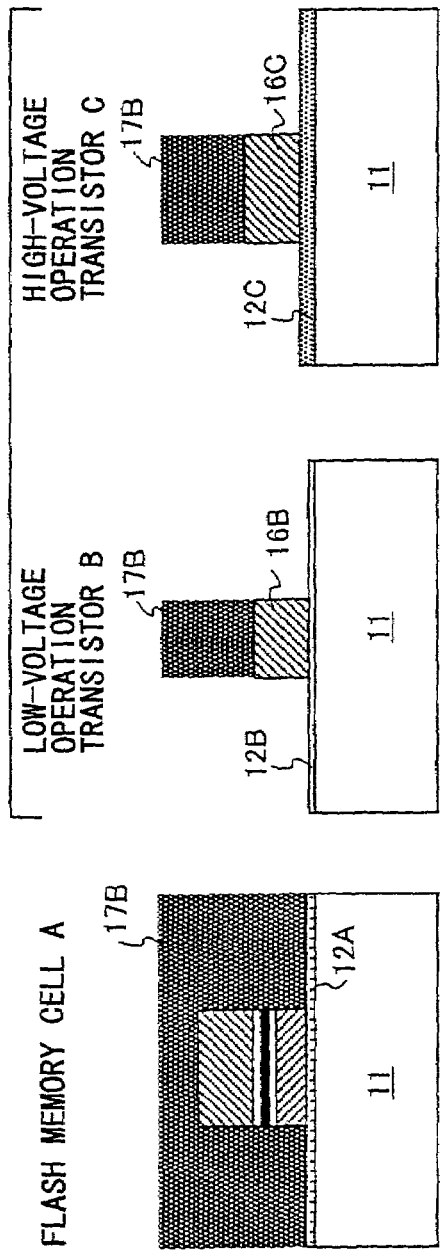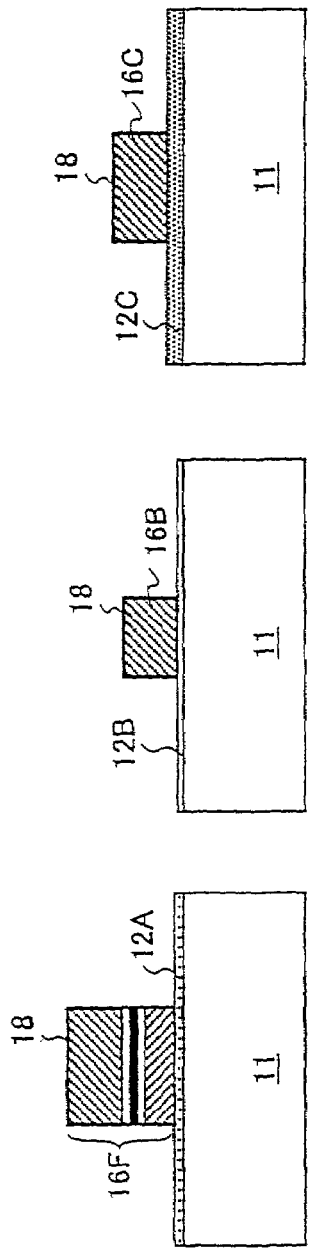
FIG. 1I PRIOR ART
FIG. 1J PRIOR ART

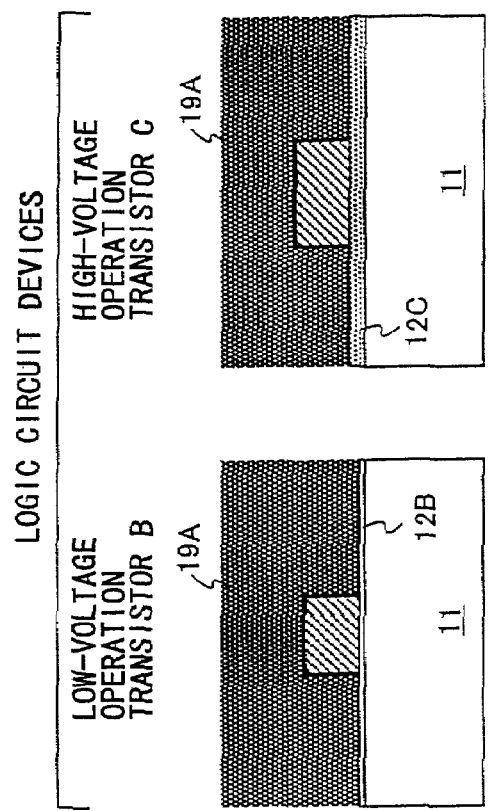
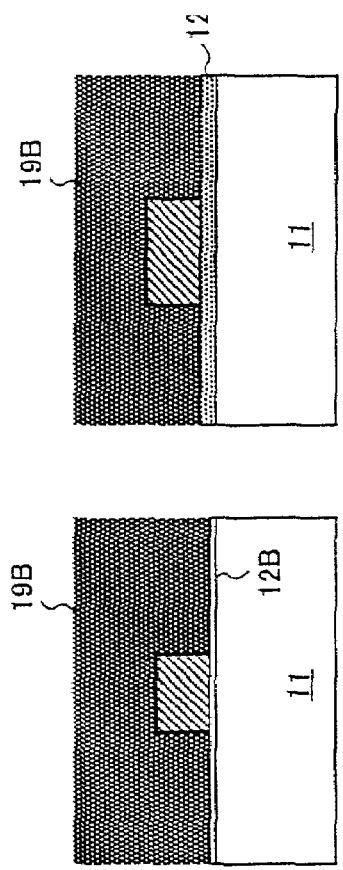
FIG. 1K PRIOR ART
FIG. 1L PRIOR ART

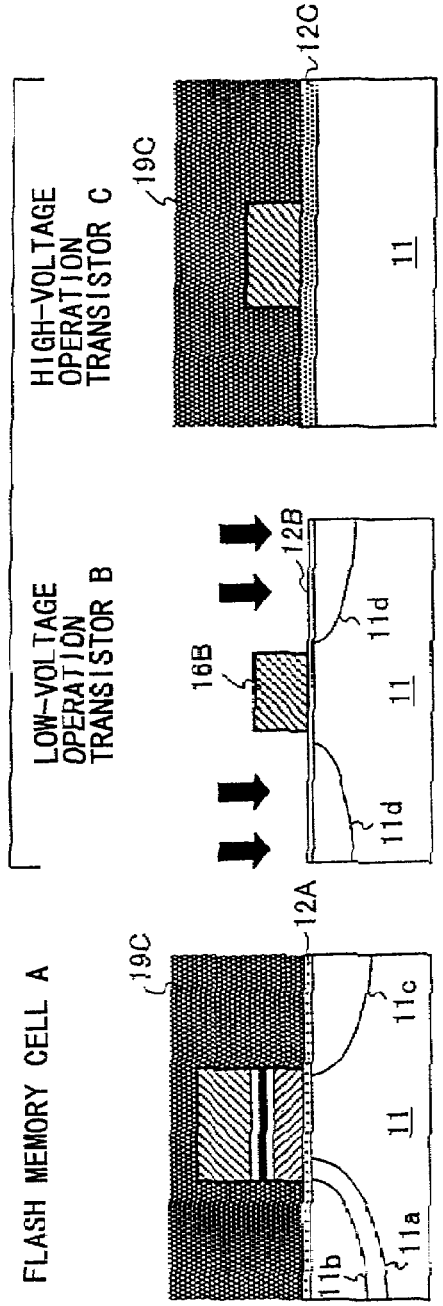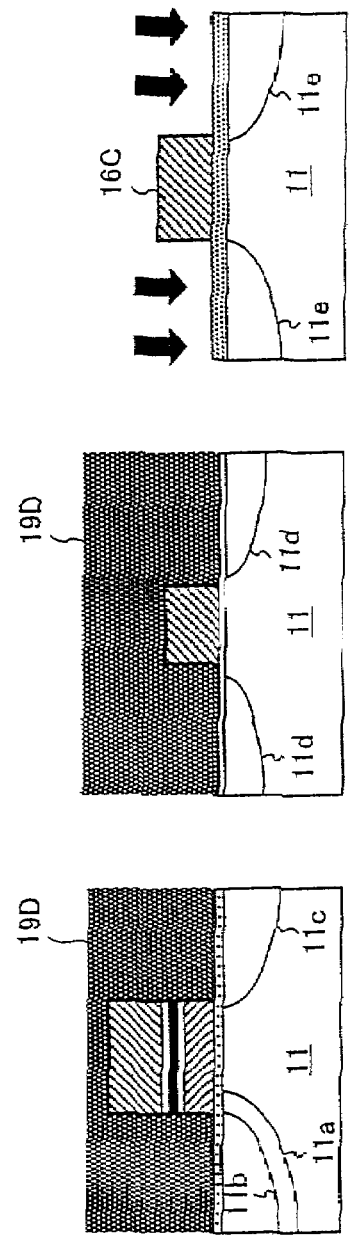
FIG. 1M PRIOR ART
FIG. 1N PRIOR ART

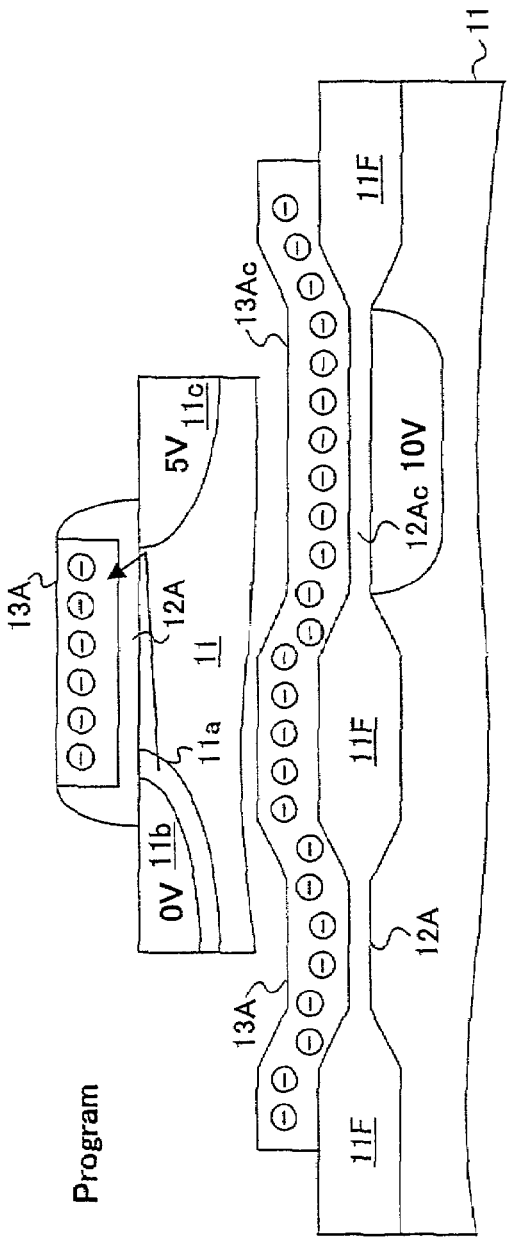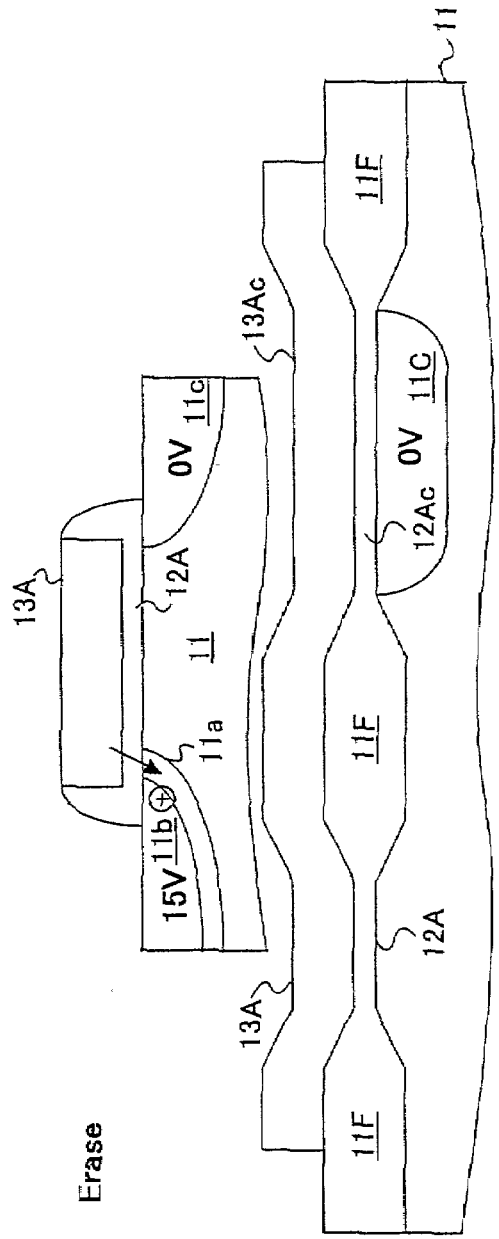
FIG. 6A RELATED ART
FIG. 6B RELATED ART
FIG. 6C RELATED ART
FIG. 6D RELATED ART

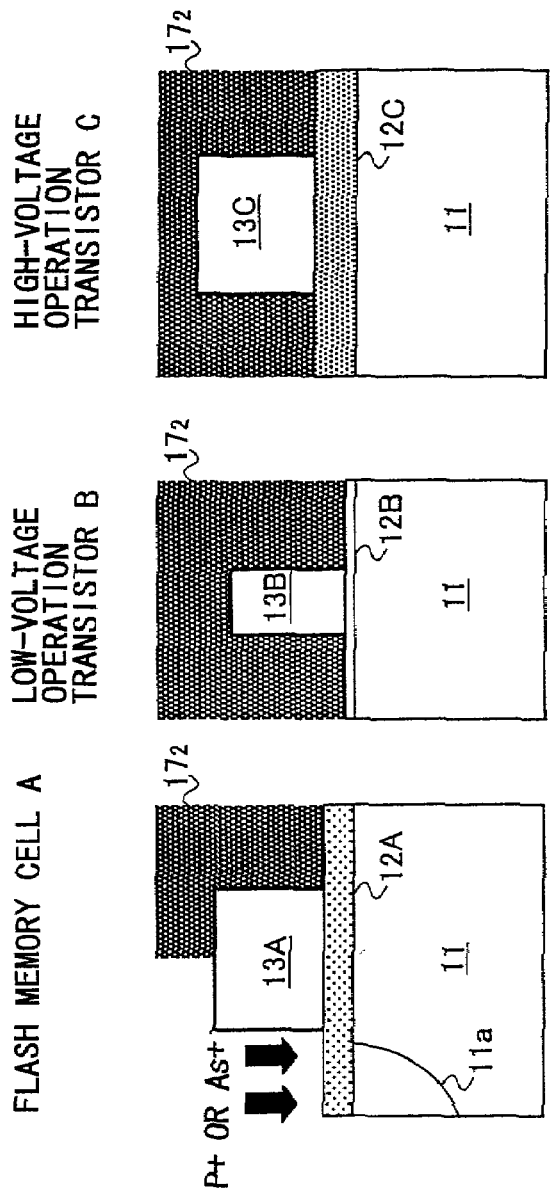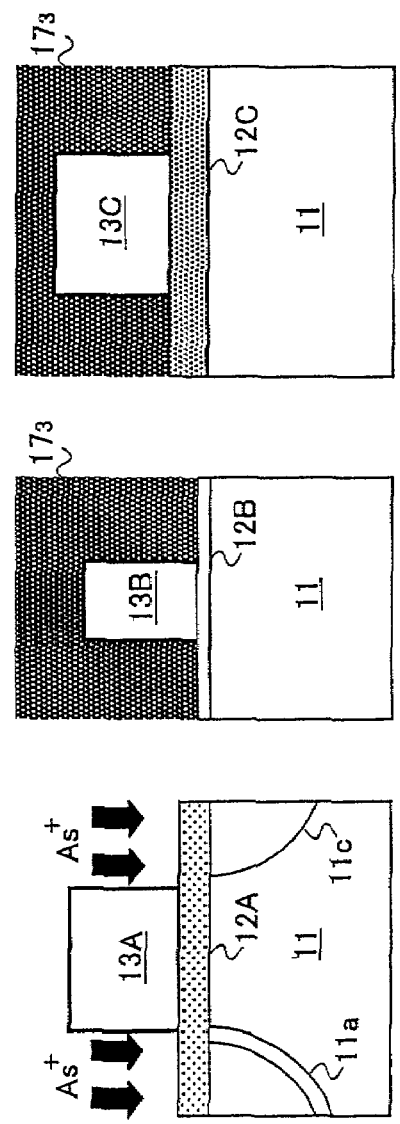
FIG. 7I RELATED ART
FIG. 7J RELATED ART

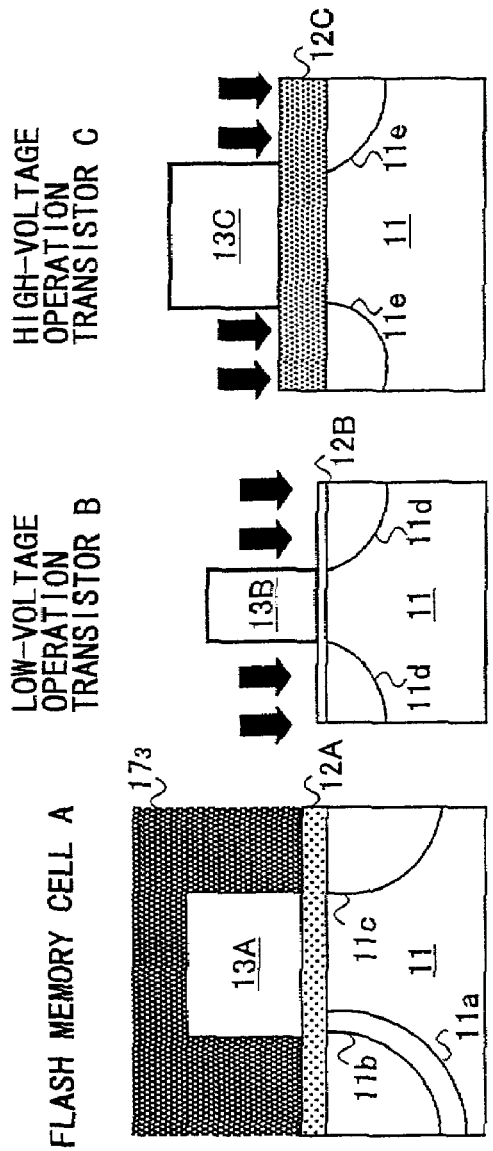
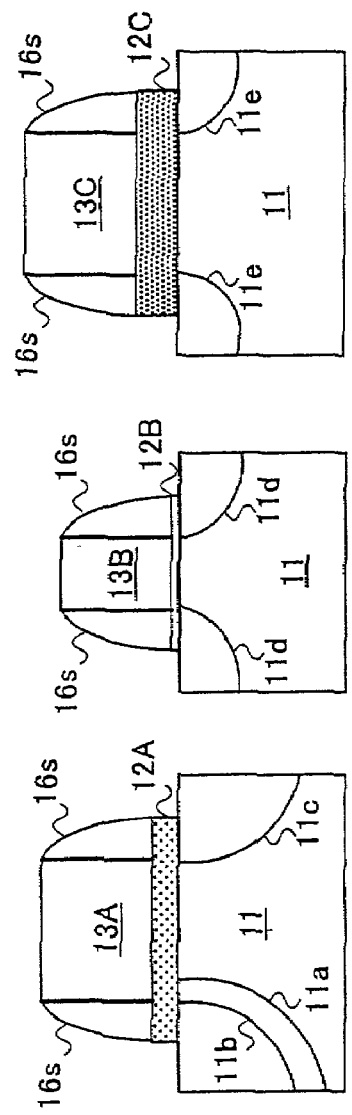
FIG. 7K RELATED ART
FIG. 7L RELATED ART

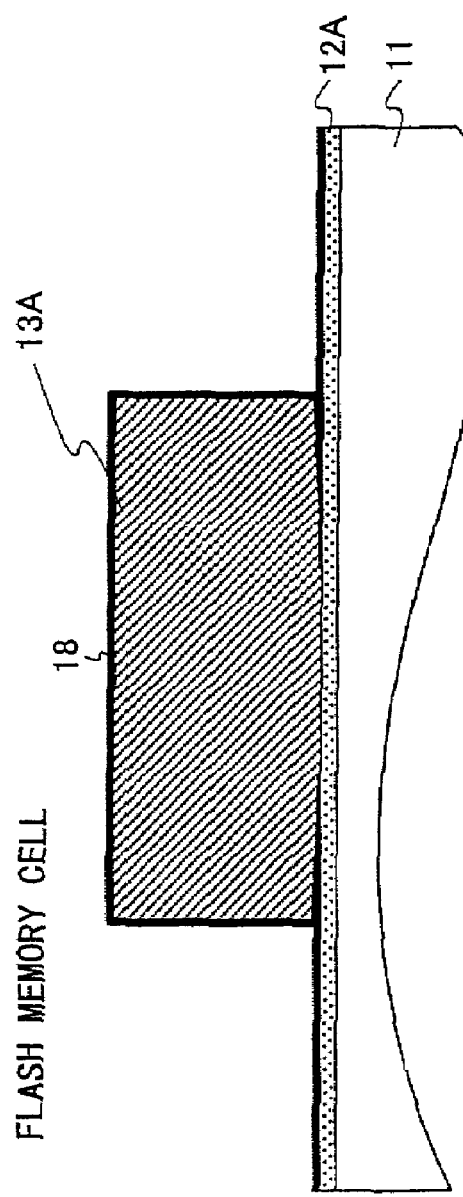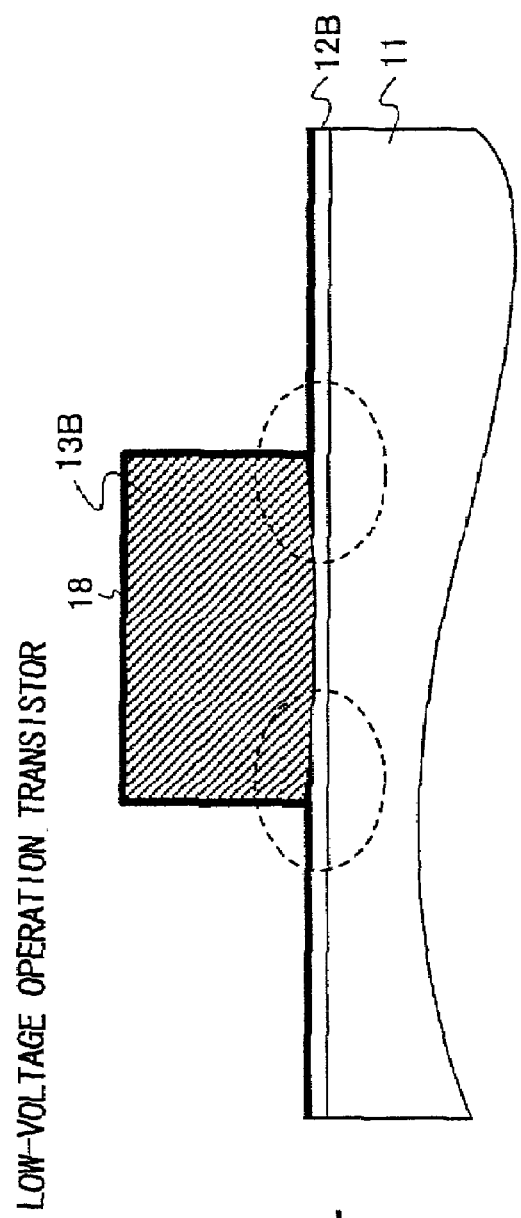
FIG. 8A
RELATED ART
FIG. 8B
RELATED ART

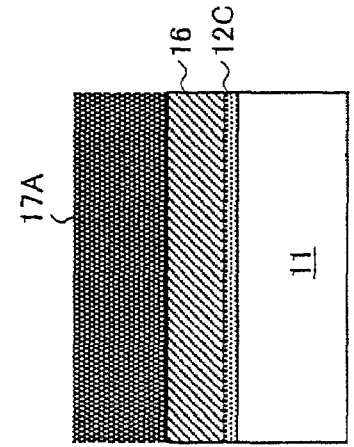
FIG. 9A
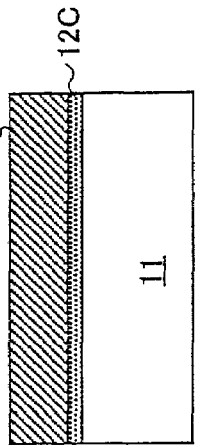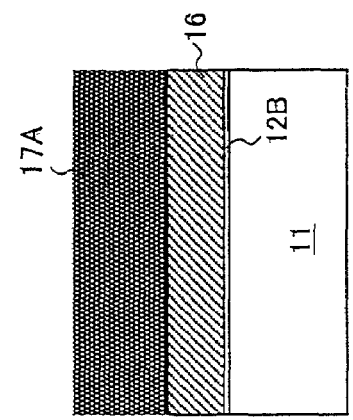
FIG. 9B

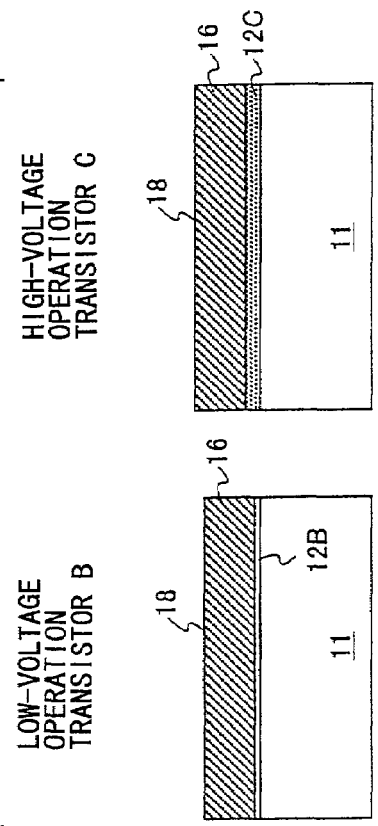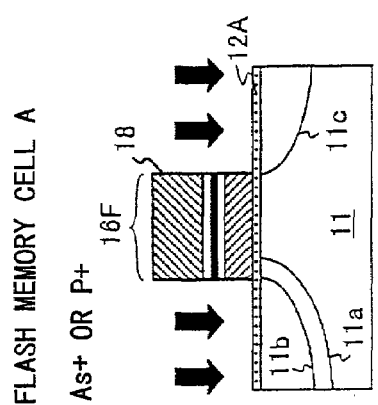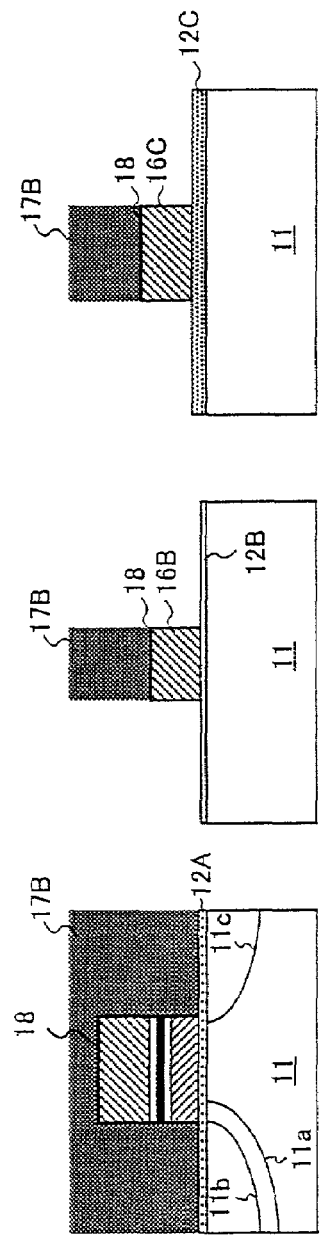
FIG. 9C
FIG. 9D

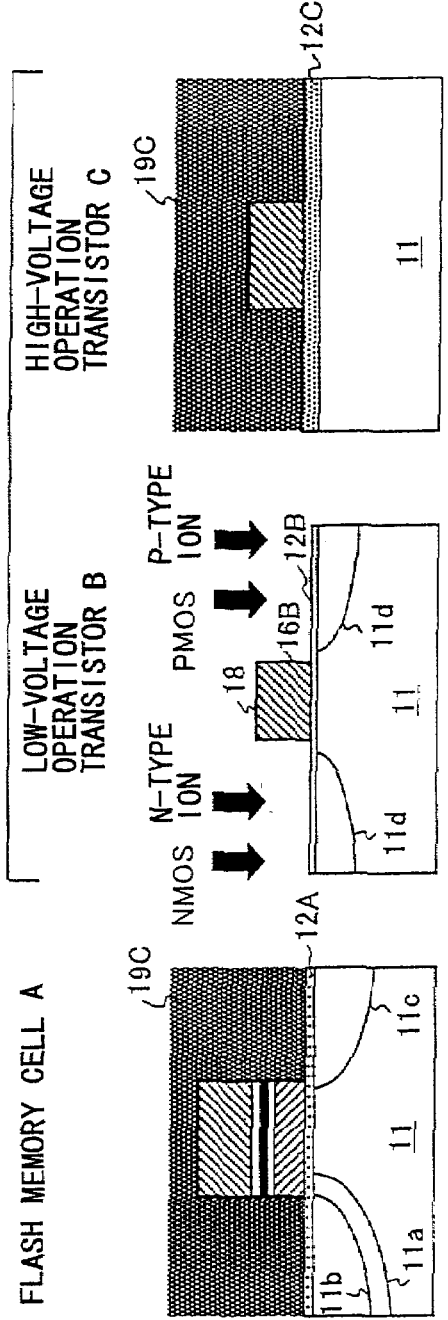

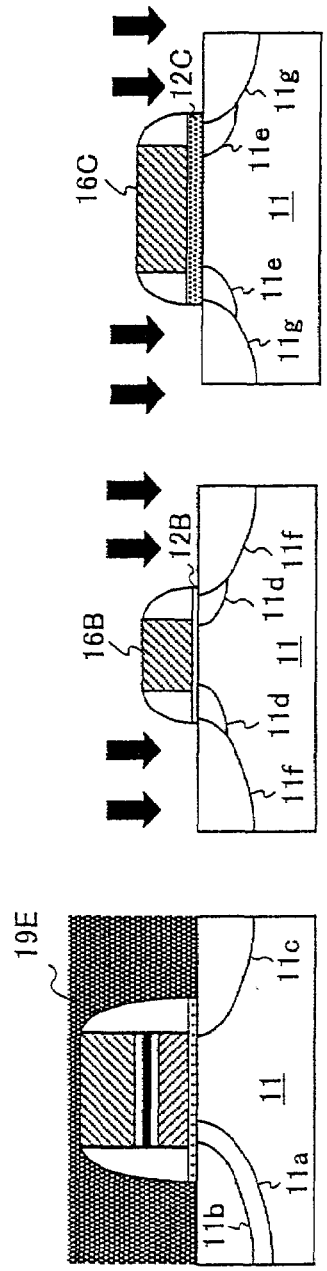
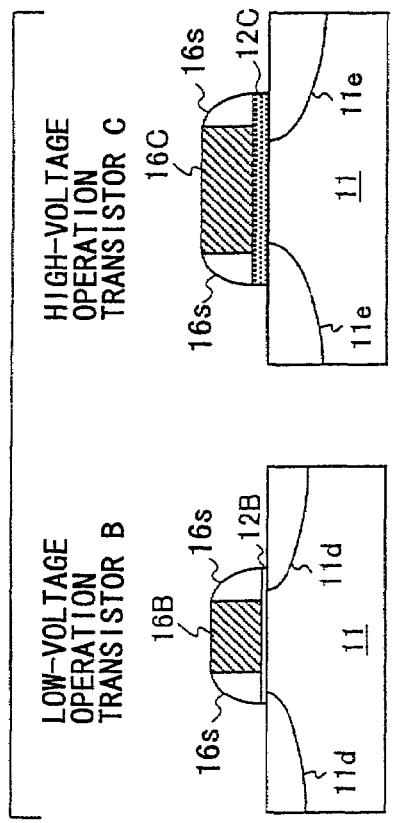
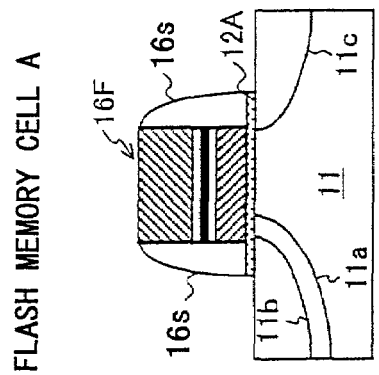
FIG. 9G
FIG. 9H

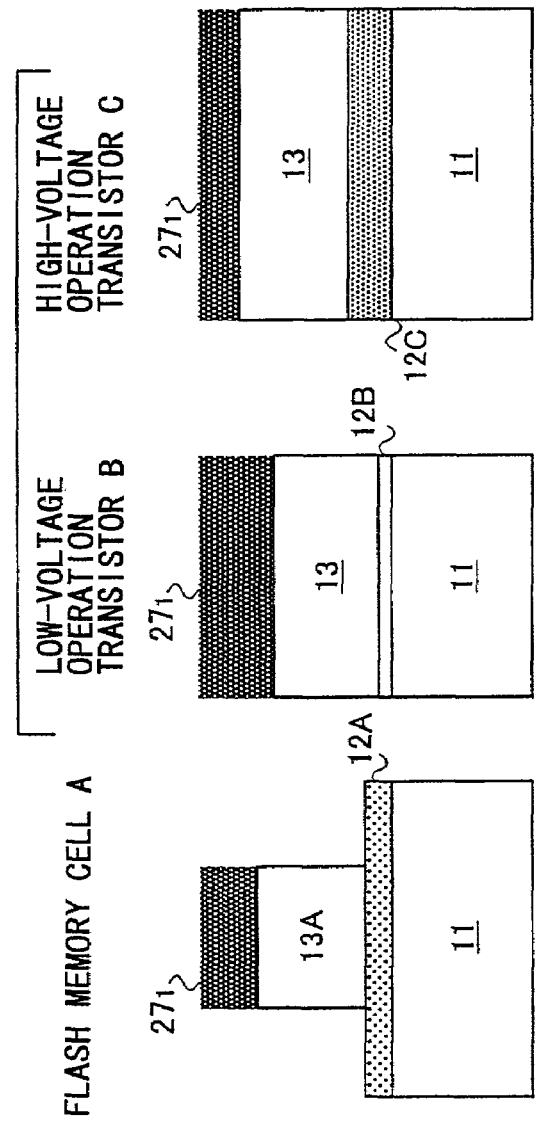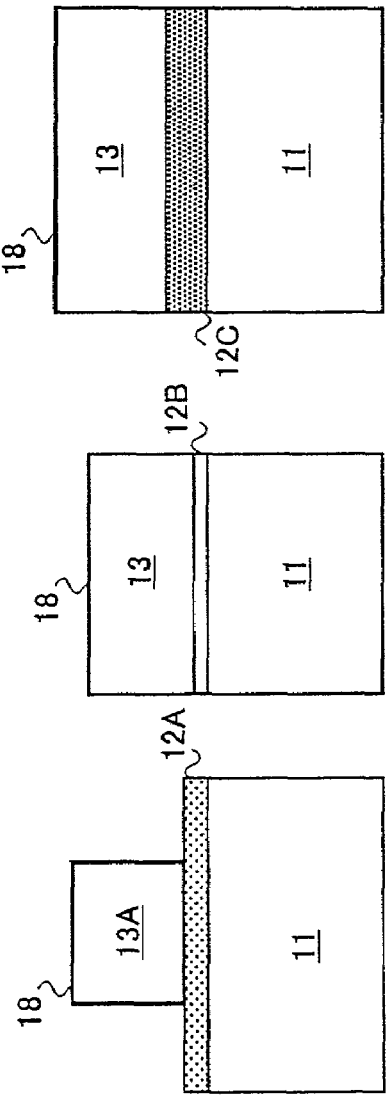
FIG. 12C
FIG. 12D

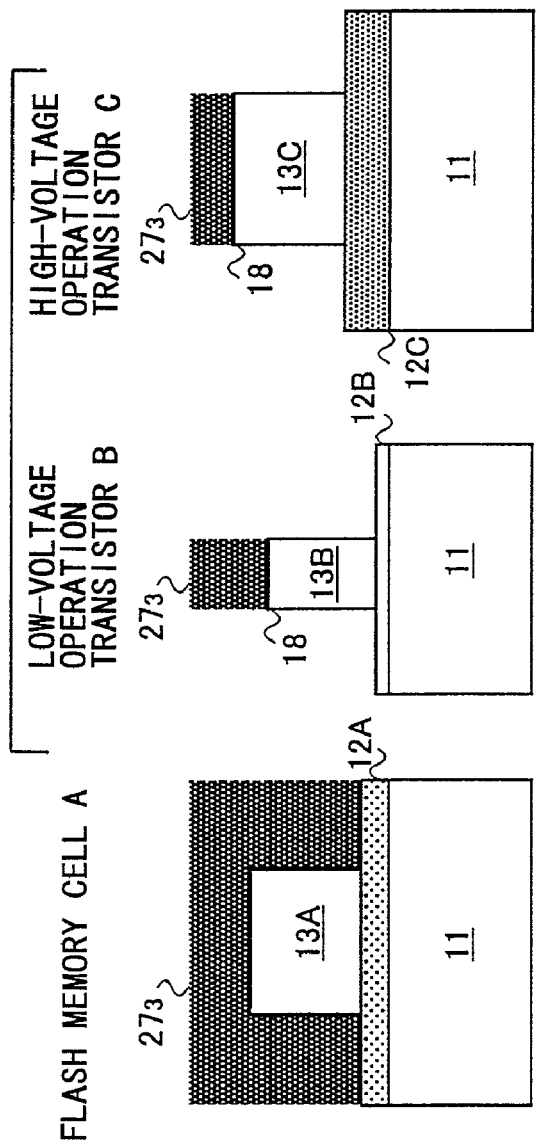
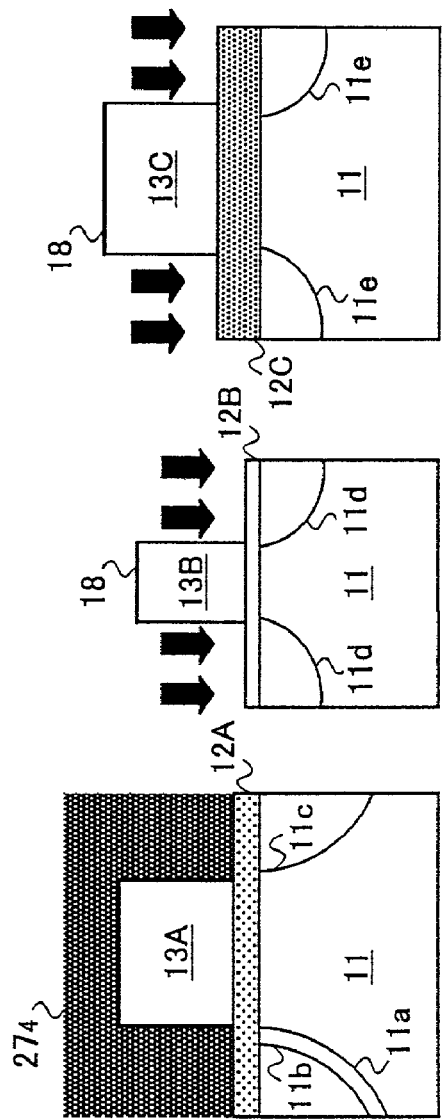
FIG. 12G
FIG. 12H

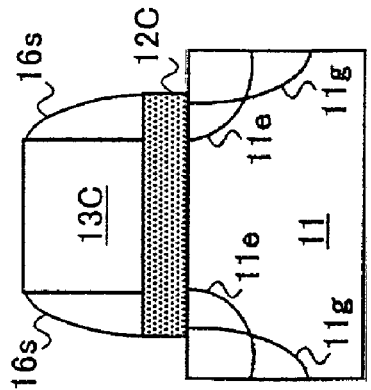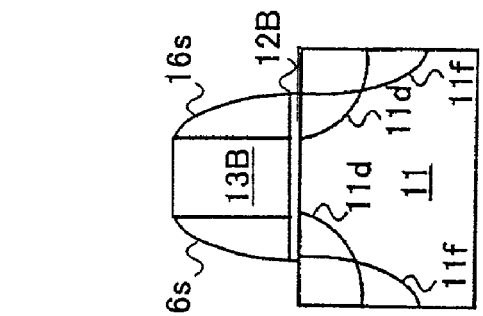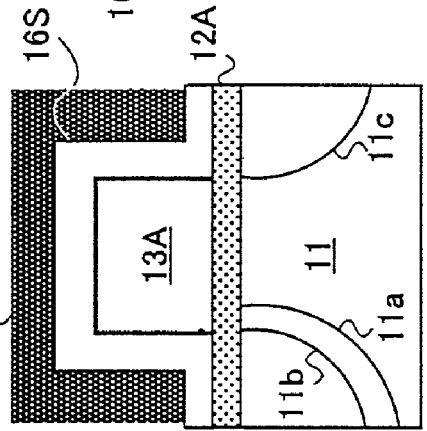
FIG. 12I

US 7,538,376 B2

SEMICONDUCTOR INTEGRATED CIRCUIT DEVICE INCLUDING A SEMICONDUCTOR DEVICE HAVING A STABLE THRESHOLD CHARACTERISTIC

CROSS-REFERENCE TO RELATED APPLICATION

The present application is based on Japanese priority application No. 2001-205188 filed on Jul. 5, 2001, the entire contents of which are hereby incorporated by reference.

BACKGROUND OF THE INVENTION

1. Field of the Invention

The present invention generally relates to semiconductor integrated circuit devices and methods of producing the same, and more particularly to a semiconductor integrated circuit device including a nonvolatile semiconductor storage device and using a plurality of supply voltages, and a method of producing such a semiconductor integrated circuit device.

A flash memory device is a nonvolatile semiconductor storage device that stores information in the form of electric charges in floating gate electrodes. The flash memory device, which has a simple device configuration, is suitable for forming a large-scale integrated circuit device.

In the flash memory device, information is written or erased by injecting hot carriers into and extracting hot carriers by the Fowler-Nordheim-type tunnel effect from the floating gate electrodes through a tunnel insulating film. Since a high voltage is required to generate such hot carriers, the flash memory device has a voltage rise control circuit that raises a supply voltage provided in its peripheral circuits cooperating with memory cells. Therefore, transistors used in such peripheral circuits have to operate at a high voltage.

On the other hand, it has been practiced of late to form such a flash memory device and a high-speed logic circuit on a common semiconductor substrate as a semiconductor integrated circuit device. In such a high-speed logic circuit, a transistor employed therein is required to operate at a low voltage. Therefore, such a semiconductor integrated circuit device is required to use a plurality of supply voltages.

2. Description of the Related Art

FIGS. 1A through 1Q are diagrams showing a production process of the conventional semiconductor integrated circuit device including such a flash memory and using a plurality of supply voltages.

In FIG. 1A, a flash memory cell region A, a low-voltage operation transistor region B, and a high-voltage operation transistor region C are formed in partitions on a silicon (Si) substrate 11 on which a field oxide film or an isolation structure (not shown in the drawing) such as a shallow trench isolation (STI) structure is formed. In the step of FIG. 1A, a tunnel oxide film 12A of a thickness of 8 to 10 nm is formed on the above-described regions A through C by performing thermal oxidation on the surface of the Si substrate 11 at temperatures ranging from 800 to 1100° C. In the step of FIG. 1B, an amorphous silicon film 13 doped with phosphorous (P) and having a thickness of 80 to 120 nm and an insulating film 14 having a so-called oxide-nitride-oxide (ONO) structure are successively deposited on the tunnel oxide film 12A. The ONO insulating film 14 is formed of a silicon dioxide ($SiO_2$) film 14c of a thickness of 5 to 10 nm deposited by chemical vapor deposition (CVD) on the amorphous silicon film 13, a silicon nitride (SiN) film 14b of a thickness of 5 to 10 nm deposited by CVD on the $SiO_2$ film 14c, and a thermal oxide film 14a of a thickness of 3 to 10 nm formed on the surface of the SiN film 14b. The ONO insulating film 14 has a good leakage-current characteristic.

Next, in the step of FIG. 1C, a resist pattern 15A is formed on the flash memory cell region A, and the ONO insulating film 14, the amorphous silicon film 13, and the tunnel oxide film 12A are removed from the low-voltage operation transistor region B and the high-voltage operation transistor region C on the Si substrate 11 by using the resist pattern 15A as a mask so that the surface of the Si substrate 11 is exposed in the regions B and C. In removing the tunnel oxide film 12A, wet etching using hydrofluoric acid (HF) is performed so that the surface of the Si substrate 11 is exposed to the HF in the regions B and C.

In the step of FIG. 1D, the resist pattern 15A is removed, and a thermal oxide film 12C of a thickness of 10 to 50 nm is formed in the regions B and C to cover the Si substrate 11 by performing thermal oxidation at temperatures ranging from 800 to 1100° C. The thermal oxide film 12C may be replaced by a thermal nitride oxide film.

In the step of FIG. 1E, another resist pattern 15B is formed in the flash memory cell region A to cover the ONO insulating film 14 and in the high-voltage operation transistor region C to cover the thermal oxide film 12C, and the thermal oxide film 12C is removed from the low-voltage operation transistor region B by HF processing by using the resist pattern 15B as a mask so that the surface of the Si substrate 11 is exposed in the region B. By the step of FIG. 1E, the surface of the Si substrate 11 is subjected to the second HF processing in the region B.

In the step of FIG. 1F, the resist pattern 15B is removed, and a thermal oxide film 12B of a thickness of 3 to 10 nm is formed on the exposed Si substrate 11 in the region B by performing thermal oxidation at temperatures ranging from 800 to 1100° C. The thermal oxide film 12B may be replaced by a thermal nitride oxide film. Further, in the step of FIG. 1F, as a result of the thermal oxidation for forming the thermal oxide film 12B, the thickness of the thermal oxide film 12C formed in the high-voltage operation transistor region C increases.

Next, in the step of FIG. 1G, an amorphous silicon film 16 doped with P and having a thickness of 100 to 250 nm is deposited on the structure of FIG. 1F by plasma CVD. The amorphous silicon film 16 may be replaced by a polysilicon film. Further, the amorphous silicon film 16 may be doped with P in a later step. In the step of FIG. 1H, a resist pattern 17A is formed on the amorphous silicon film 16, and by using the resist pattern 17A as a mask, patterning is performed successively on the amorphous silicon film 16, the ONO insulating film 14, and the amorphous silicon film 13 in the flash memory cell region A so that a multilayer gate electrode structure 16F of the flash memory which structure is formed of an amorphous silicon pattern 13A, an ONO pattern 14A, and an amorphous silicon pattern 16A and includes the amorphous silicon pattern 13A as a floating gate electrode is formed in the region A. In the step of FIG. 1G, it is possible to form a silicide film of, for instance, tungsten silicide (WSi) or cobalt silicide (CoSi) on the amorphous silicon film 16 as required. Further, it is also possible to form a non-doped polysilicon film and then form an n-type gate electrode of P or arsenic (As) or a p-type gate electrode of boron (B) or difluoroboron ($BF_2$) in a later step of ion implantation.

Next, in the step of FIG. 1I, the resist pattern 17A is removed, and a new resist pattern 17B is formed to cover the flash memory cell region A. By using the resist pattern 17B as a mask, patterning is performed on the amorphous silicon film 16 in the low-voltage operation transistor region B and the high-voltage operation transistor region C so that a gate electrode 16B of a low-voltage operation transistor and a gate electrode 16C of a high-voltage operation transistor are formed in the regions B and C, respectively.

Next, in the step of FIG. 1J, the resist pattern 17B is removed, and a protection oxide film (also referred to as a protection insulating film or a thermal oxide film) 18 is formed, by performing thermal oxidation at temperatures ranging from 800 to 900° C., to cover each of the multilayer gate electrode structure 16F in the flash memory cell region A, the gate electrode 16B in the low-voltage operation transistor region B, and the gate electrode 16C in the high-voltage operation transistor region C.

Next, in the step of FIG. 1K, a resist pattern 19A is formed on the structure of FIG. 1J so as to cover the low-voltage operation transistor region B, the high-voltage operation transistor region C, and a part of the flash memory cell region A. By using the resist pattern 19A and the multilayer gate electrode structure 16F as masks, ion implantation of $P^+$ is performed typically with a dose of $1 \times 10^{14}$ to $3 \times 10^{14}$ cm$^{-2}$ at accelerating voltages ranging from 30 to 80 keV so that an n-type diffusion region 11a is formed next to the multilayer gate electrode structure 16F in the Si substrate 11. $P^+$ may be replaced by $As^+$.

In the step of FIG. 1K, by using the resist pattern 19A as a mask, ion implantation of $As^+$ is performed typically with a dose of $1 \times 10^{15}$ to $6 \times 10^{15}$ cm$^{-2}$ at accelerating voltages ranging from 30 to 50 keV so that another n-type diffusion region 11b is formed inside the n-type diffusion region 11a. In the step of FIG. 1K, no ion implantation is performed in the low-voltage operation transistor region B and the high-voltage operation transistor region C since the regions B and C are covered with the resist pattern 19A.

Next, in the step of FIG. 1L, the resist pattern 19A is removed, and a new resist pattern 19B is formed to cover the regions B and C and leave the region A exposed. Further, in the step of FIG. 1L, by using the resist pattern 19B as a mask, ion implantation of $As^+$ is performed with a dose of $5 \times 10^{14}$ to $5 \times 10^{15}$ cm$^{-2}$ at accelerating voltages ranging from 30 to 50 keV. $As^+$ may be replaced by $P^+$. As a result, an impurity concentration is increased in the n-type diffusion region 11b and at the same time, a yet another n-type diffusion region 11c is formed in the flash memory cell region A by using the multilayer gate electrode structure 16F as a self-alignment mask. At this point, the step of FIG. 1K may be deleted.

Next, in the step of FIG. 1M, the resist pattern 19B is removed, and a resist pattern 19C is formed on the Si substrate 11 so as to leave only the low-voltage operation transistor region B exposed. Further, in the step of FIG. 1M, ion implantation of a p-type or n-type impurity is performed by using the resist pattern 19C as a mask so that a pair of lightly doped drain (LDD) diffusion regions 11d are formed on both sides of the gate electrode 16B in the Si substrate 11 in the region B with the gate electrode 16B serving as a self-alignment mask.

Next, in the step of FIG. 1N, the resist pattern 19C is removed, and a resist pattern 19D is formed on the Si substrate 11 so as to leave only the high-voltage operation transistor region C exposed. Further, in the step of FIG. 1N, ion implantation of a p-type or n-type impurity element is performed by using the resist pattern 19D as a mask so that a pair of LDD diffusion regions 11e are formed on both sides of the gate electrode 16C in the Si substrate 11 in the region C. The diffusion regions 11d and 11e may be formed in the same step.

Further, in the step of FIG. 1O, sidewall insulating films 16s are formed on both sides of each of the multilayer gate electrode structure 16F, the gate electrode 16B, and the gate electrode 16C by depositing and performing etchback on a CVD oxide film. In the step of FIG. 1P, a resist pattern 19E is formed to cover the flash memory cell region A and leave the low-voltage operation transistor region B and the high-voltage operation transistor region C exposed. Further, by performing ion implantation of a p-type or n-type impurity element with the resist pattern 19E and the gate electrodes B and C serving as a mask, p-type or n-type diffusion regions 11f are formed on both sides of the gate electrode 16B in the Si substrate 11 in the region B, and similarly, p-type or n-type diffusion regions 11g are formed on both sides of the gate electrode 16C in the Si substrate 11 in the region C. A low-resistance silicide film of, for instance, WSi or CoSi may be formed as required on the surface of each of the diffusion regions 11f and 11g by silicide processing.

In the step of FIG. 1Q, an interlayer insulating film 20 is formed on the Si substrate 11 so as to continuously cover the regions A through C. Further, in the region A, contact holes are formed in the interlayer insulating film 20 so that the diffusion regions 11b and 11c are exposed, and W plugs 20A are formed in the contact holes. Likewise, in the region B, contact holes are formed in the interlayer insulating film 20 so that the diffusion regions 11f are exposed, and W plugs 20B are formed in the contact holes. In the region C, contact holes are formed in the interlayer insulating film 20 so that the diffusion regions 11g are exposed, and W plugs 20C are formed in the contact holes.

In the production process of the semiconductor integrated circuit device including the flash memory device having the multilayer gate electrode structure 16F, in the step of FIG. 1J, the protection oxide film 18 of a thickness of 5 to 10 nm is formed on the sidewall faces of the multilayer gate electrode structure 16F by thermal oxidation performed at temperatures ranging from 800 to 900° C. As a result of the thermal oxidation, the protection oxide film 18 is formed not only on the multilayer gate electrode structure 16F but also on the sidewall faces of each of the gate electrode 16B formed in the low-voltage operation transistor region B and the gate electrode 16C formed in the high-voltage operation transistor region C as shown in FIGS. 2A and 2B.

At this point, the protection oxide film 18 forms bird's beaks that penetrate under the gate electrode 16B in the region B as shown circled by broken lines in FIG. 2B. Therefore, especially in a low-voltage operation transistor whose gate length is short, that is, whose gate oxide film 12B is thin, a substantial change in the thickness of the gate oxide film 12B is effected right under the gate electrode 16B, thus causing a problem that a threshold characteristic shifts from a desired value.

Indeed, such a problem is prevented from occurring if the protection oxide film 18 is not formed. However, without formation of the protection oxide film 18, electrons retained in the amorphous silicon pattern 13A (hereinafter, also referred to as a floating gate electrode pattern 13A) are dissipated to the sidewall insulating films 16s formed by CVD and etchback in the step of FIG. 1O as shown in FIG. 3B so that information stored in the flash memory device is lost in a short period of time. On the other hand, with the protection oxide film 18 that is a high-quality thermal oxide film hardly allowing a leakage current being formed on the sidewalls of the floating gate electrode pattern 13A, the electrons injected into the floating gate electrode pattern 13A are stably retained therein as shown in FIG. 3A.

Therefore, it is essential to form the protection oxide film 18 in the semiconductor integrated circuit device including the flash memory device. However, formation of such a protection oxide film inevitably causes the problem of a change in the threshold characteristic of a MOS transistor forming a peripheral or logic circuit. Such a problem of a change in the threshold characteristic of the MOS transistor is noticeable when the MOS transistor is a high-speed transistor having a short gate length.

FIG. 4 is a plan view of a configuration of a flash memory cell (flash memory device) having a single-layer gate electrode structure by related art. In FIG. 4, the same element as those of the previous drawings are referred to by the same numerals, and a description thereof will be omitted.

According to FIG. 4, a device region 11A is formed on the Si substrate 11 by a field oxide film 11F. One end of the above-described floating gate electrode pattern 13A is formed on the Si substrate 11 to cross the device region 11A. In the device region 11A, by using the floating gate electrode pattern 13A as a self-alignment mask, the $n^-$-type source region 11a and the $n^+$-type source line region 11b are formed on one side, and the $n^+$-type drain region 11c is formed on the other side.

On the Si substrate 11, another device region 11B is formed next to the device region 11A. An $n^+$-type diffusion region 11C is formed in the device region 11B. The other end of the floating gate electrode pattern 13A is formed as a coupling part 13Ac covering the diffusion region 11C.

FIG. 5A is a sectional view of the flash memory cell of FIG. 4 taken along the line X-X'.

According to FIG. 5A, the tunnel oxide film 12A is formed between the source line region 11b and the drain region 11c on the Si substrate 11, and the floating gate electrode pattern 13A is formed on the tunnel oxide film 12A. Further, the $n^-$-type source region 11a is formed outside the $n^+$-type source line region 11b in the Si substrate 11. The sidewall insulating films 16s are formed on the sidewalls of the floating gate electrode pattern 13A.

FIG. 5B is a sectional view of the flash memory cell of FIG. 4 taken along the line Y-Y'.

According to FIG. 5B, the floating gate electrode pattern 13A continuously extends from the device region 11A to the adjacent device region 11B on the field oxide film 11F formed on the Si substrate 11. The coupling part 13Ac of the floating gate electrode pattern 13A is capacitive-coupled via an oxide film 12Ac to the high-density diffusion region 11C.

At the time of a write (program) operation, by providing the source line region 11b, applying a drain voltage of +5 V to the drain region 11c, and applying a write voltage of +10 V to the high-density diffusion region 11C as shown in FIGS. 6A and 6B, the potential of the floating gate electrode pattern 13A rises so that hot electrons are injected into the floating gate electrode pattern 13A via the tunnel oxide film 12A in the device region 11A.

On the other hand, at the time of an erase operation, an erase voltage of +15 V is applied to the source line region 11b with the drain region 11c and the high-density diffusion region 11C being grounded as shown in FIGS. 6C and 6D. As a result, the electrons in the floating gate electrode pattern 13A tunnel through the tunnel oxide film 12A to the source region 11a to be absorbed into a source power supply through the source line region 11b.

Thus, in the flash memory cell of FIG. 4, the high-density diffusion region 11C serves as a control gate electrode, and unlike the conventional flash memory cell of a multilayer gate structure, it is unnecessary to form the above-described ONO insulating film 14 between the polysilicon floating gate electrode and the polysilicon control gate electrode. In the flash memory cell of FIGS. 5A and 5B, the oxide film 12Ac serves as the ONO insulating film 14. Since the oxide film 12Ac is formed on the Si substrate 11 by thermal oxidation, the oxide film 12Ac has high quality.

FIGS. 7A through 7M are diagrams showing a production process of a semiconductor integrated circuit device including the flash memory cell of FIG. 4 in addition to the low-voltage operation transistor B and the high-voltage operation transistor C. In the drawings, the same elements as those previously described are referred to by the same numerals, and a description thereof will be omitted.

According to FIG. 7A, the thermal oxide film 12C of a thickness of 5 to 50 nm is formed on the Si substrate 11 by performing thermal oxidation at temperatures ranging from 800 to 1100° C. in each of the flash memory cell region A, the low-voltage operation transistor region B, and the high-voltage operation transistor region C. In the step of FIG. 15B, the thermal oxide film 12C is removed from the flash memory cell region A by a patterning process using a resist pattern $15_1$.

Next, in the step of FIG. 7C, the resist pattern $15_1$ is removed, and the tunnel oxide film 12A of a thickness of 5 to 15 nm is formed on the surface of the Si substrate 11 in the region A by performing thermal oxidation at temperatures ranging from 800 to 1100° C. In the step of FIG. 7C, as a result of the thermal oxidation for forming the tunnel oxide film 12A, the thermal oxide film 12C is developed in each of the regions B and C.

Next, in the step of FIG. 7D, the thermal oxide film 12C is removed from the low-voltage operation transistor region B by a patterning process using a resist pattern $15_2$. Then, in the step of FIG. 7E, after the resist pattern $15_2$ is removed, the thermal oxide film 12B of a thickness of 3 to 10 nm is formed on the exposed Si substrate 11 in the region B by performing thermal oxidation at temperatures ranging from 800 to 1100° C. In the step of FIG. 7E, as a result of the thermal oxidation for forming the thermal oxide film 12B, the tunnel oxide film 12A is developed in the region A and the thermal oxide film 12C is developed in the region C.

Next, in the step of FIG. 7F, the amorphous silicon film 13 uniformly doped with P and having a thickness of 150 to 200 nm is formed on the Si substrate 11. In the step of FIG. 7G, patterning is performed on the amorphous silicon film 13 with a resist pattern $17_1$ serving as a mask, so that the floating gate electrode pattern 13A is formed in the flash memory cell region A, a gate electrode pattern 13B is formed in the low-voltage operation transistor region B, and a gate electrode pattern 13C is formed in the high-voltage operation transistor region C.

Next, in the step of FIG. 7H, the surfaces of the floating gate electrode pattern 13A and the gate electrode patterns 13B and 13C are covered with the protection oxide film 18 of a thickness of 5 to 10 nm by thermal oxidation at temperatures ranging from 800 to 900° C. Then, in the step of FIG. 7I, with a resist pattern $17_2$ serving as a mask, the source region 11a is formed by performing ion implantation of $P^+$ or $As^+$ with a dose of $1 \times 10^{14}$ to $5 \times 10^{14}$ cm$^{-2}$ at accelerating voltages ranging from 30 to 80 keV.

Further, in the step of FIG. 7J, with the regions B and C being covered with a resist pattern $17_3$, ion implantation of $As^+$ is performed with a dose of $5 \times 10^{14}$ to $3 \times 10^{15}$ cm$^{-2}$ at accelerating voltages ranging from 30 to 50 keV in the region A by using the floating gate electrode pattern 13A as a self-alignment mask. Thereby, the $n^+$-type source line region 11b is formed inside the source region 11a and the $n^+$-type drain region 11c is formed on the opposite side of a channel region from the source region 11a.

Next, in the step of FIG. 7K, a resist pattern $17_3$ covering the flash memory cell region A is formed, and the LDD regions 11d and 11e are formed in the regions B and C, respectively, by ion implantation of a p-type or n-type impurity element.

Further, in the step of FIG. 7L, the sidewall oxide films 16s are formed on both sidewalls of each of the floating gate electrode pattern 13A and the gate electrode patterns 13B and 13C. In the step of FIG. 7M, with the flash memory region A being covered with a resist pattern 17₄, the diffusion regions 11f and 11g are formed in the regions B and C, respectively, by ion implantation of a p-type or n-type impurity element.

Also in the production of the semiconductor integrated circuit device including the flash memory device of such a single-layer gate structure, when the thermal oxide film 18 is formed as a protection insulating film to cover the single-layer gate electrode structure (the floating gate electrode pattern) 13A in the flash memory cell region A as shown in detail in FIG. 8A in the step of FIG. 7H, the same thermal oxide film 18 is also formed in the low-voltage transistor region B so as to cover the gate electrode 13B as shown in FIG. 8B. As a result, bird's beaks that penetrate right under the gate electrode 13B are formed as shown circled in FIG. 8B. Therefore, the low-voltage operation transistor formed in the region B is prevented from having a desired threshold characteristic.

SUMMARY OF THE INVENTION

It is a general object of the present invention to provide a semiconductor integrated circuit device and a method of producing the same in which the above-described disadvantage is eliminated.

A more specific object of the present invention is to provide a semiconductor integrated circuit device in which formation of bird's beak right under the gate electrode of a semiconductor device formed together with a flash memory device on a substrate is effectively prevented.

Yet another object of the present invention is to provide a method of producing such a semiconductor integrated circuit device.

The above objects of the present invention are achieved by a semiconductor integrated circuit device including a substrate, a nonvolatile memory device formed in a memory cell region of the substrate and having a multilayer gate electrode structure including a tunnel insulating film covering the substrate and a floating gate electrode formed on the tunnel insulating film and having sidewall surfaces covered with a protection insulating film formed of a thermal oxide film, and a semiconductor device formed in a device region of the substrate, the semiconductor device including a gate insulating film covering the substrate and a gate electrode formed on the gate insulating film, wherein a bird's beak structure is formed of a thermal oxide film at an interface of the tunnel insulating film and the floating gate electrode, the bird's beak structure penetrating into the floating gate electrode along the interface from the sidewall faces of the floating gate electrode, and the gate insulating film is interposed between the substrate and the gate electrode to have a substantially uniform thickness.

The above objects of the present invention are also achieved by a semiconductor integrated circuit device including: a substrate; a nonvolatile memory device formed in a memory cell region of the substrate, the nonvolatile memory device including a first active region covered with a tunnel insulating film, a second active region formed next to the first active region and covered with an insulating film, a control gate formed of an embedded diffusion region formed in the second active region, a first gate electrode extending on the tunnel insulating film in the first active region and forming a bridge between the first and second active regions to be capacitive-coupled via the insulating film to the embedded diffusion region in the second active region, the first gate electrode having sidewall faces thereof covered with a protection insulating film formed of a thermal oxide film, and a diffusion region formed on each of sides of the first gate electrode in the first active region; and a semiconductor device formed in a device region of the substrate, the semiconductor device including a gate insulating film covering the substrate and a second gate electrode formed on the gate insulating film, wherein a bird's beak structure is formed of a thermal oxide film at an interface of the tunnel insulating film and the first gate electrode, the bird's beak structure penetrating into the first gate electrode along the interface from the sidewall faces of the first gate electrode, and the gate insulating film is interposed between the substrate and the second gate electrode to have a substantially uniform thickness.

According to the above-described semiconductor integrated circuit devices, no bird's beak structure is formed to penetrate into the second gate electrode. Therefore, the problem of a change in the threshold characteristic of the semiconductor device can be avoided.

The above objects of the present invention are also achieved by a method of producing a semiconductor integrated circuit device, including the steps of (a) forming a semiconductor structure including a tunnel insulating film covering a memory cell region of a substrate, a first silicon film covering the tunnel insulating film, an insulating film covering the first silicon film, and a gate insulating film covering a logic device region of the substrate, (b) depositing a second silicon film on the semiconductor structure formed in the step (a) so that the second silicon film covers the insulating film in the memory cell region and the gate insulating film in the logic device region, (c) forming a multilayer gate electrode structure in the memory cell region by successively patterning the second silicon film to serve as a control gate electrode, the insulating film, and the first silicon film in the memory cell region with the second silicon film being left in the logic device region, (d) forming a protection oxide film so that the protection oxide film covers the multilayer gate electrode structure in the memory cell region and the second silicon film in the logic device region, (e) forming diffusion regions in both sides of the multilayer gate electrode structure in the memory cell region by performing ion implantation of an impurity element into the substrate with the multilayer gate electrode structure and the second silicon film being employed as masks, (f) forming a gate electrode in the logic device region by patterning the second silicon film, and (g) forming diffusion regions in the logic device region by performing ion implantation with the gate electrode being employed as a mask, whereby a nonvolatile memory device is formed in the memory cell region and a semiconductor device is formed in the logic device region.

The above objects of the present invention are further achieved by a method of producing a semiconductor integrated circuit device, including the steps of (a) forming a semiconductor structure including a tunnel insulating film covering a memory cell region of a substrate and a gate insulating film covering a logic device region of the substrate, (b) depositing a silicon film on the semiconductor structure formed in the step (a) so that the silicon film covers the tunnel insulating film in the memory cell region and the gate insulating film in the logic device region, (c) forming a first gate electrode in the memory cell region by selectively patterning the silicon film with the silicon film being left in the logic device region, (d) forming a protection oxide film so that the protection oxide film covers the first gate electrode in the memory cell region and the silicon film in the logic device region, (e) forming diffusion regions on both sides of the first gate electrode in the memory cell region by performing ion implantation of an impurity element into the substrate with the first gate electrode and the silicon film being employed as masks, (f) forming a second gate electrode in the logic device region by patterning the silicon film, and (g) forming diffusion regions in the logic device region by performing ion implantation with the second gate electrode being employed as a mask, whereby a nonvolatile memory device is formed in the memory cell region and a semiconductor device is formed in the logic device region.

According to the above-described methods, the protection oxide film is formed to cover the multilayer gate electrode structure or the gate electrode in the memory cell region before the gate electrode is patterned in the logic device region. The protection oxide film prevents the bird' beak structure from being formed as a penetration into the gate electrode in the logic device region. Therefore, the problem of a change in the threshold characteristic of the semiconductor device in the device region can be avoided. Further, when the diffusion regions are formed in the memory cell region by ion implantation, the device region is covered with the silicon film. By using the silicon film as a mask, a resist process may be omitted, thus simplifying the production process of the semiconductor integrated circuit device.

BRIEF DESCRIPTION OF THE DRAWINGS

Other objects, features and advantages of the present invention will become more apparent from the following detailed description when read in conjunction with the accompanying drawings, in which:

FIGS. 6A through 6D are diagrams for illustrating write and erase operations of the flash memory cell of FIG. 4;

FIGS. 7A through 7M are diagrams showing a production process of a semiconductor integrated circuit device including the flash memory cell of FIG. 4

FIGS. 8A and 8B are diagrams for illustrating a disadvantage of the semiconductor integrated circuit device including the flash memory cell of FIG. 4;

FIGS. 9A through 9I are diagrams showing a production process of a semiconductor integrated circuit device according to a first embodiment of the present invention;

FIGS. 12A through 12I are diagrams showing a production process of a semiconductor integrated circuit device according to a second embodiment of the present invention.

DETAILED DESCRIPTION OF THE PREFERRED EMBODIMENTS

Figure 1A:
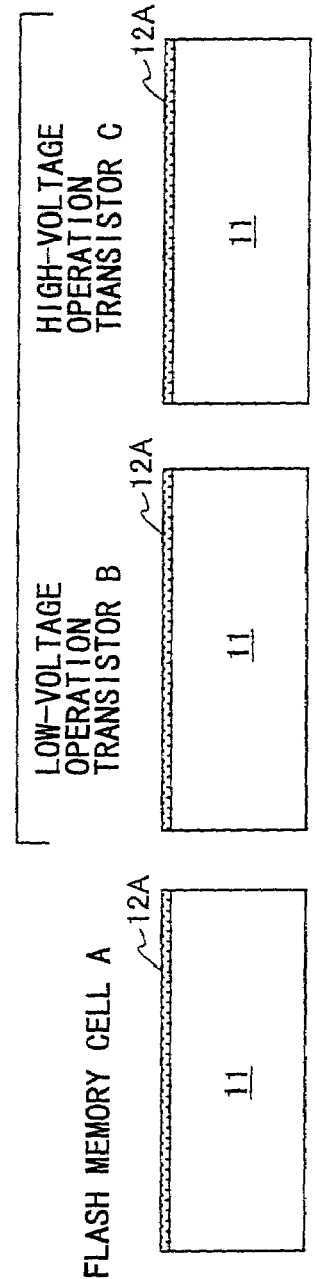
FIGS. 1A through 1Q are diagrams showing a production process of a conventional semiconductor integrated circuit device including a flash memory device of a multilayer gate structure.
Figure 1B:
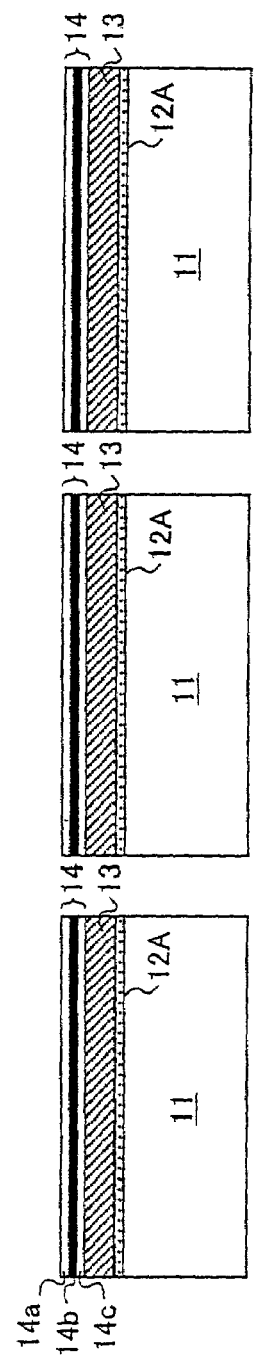
Figure 1C:
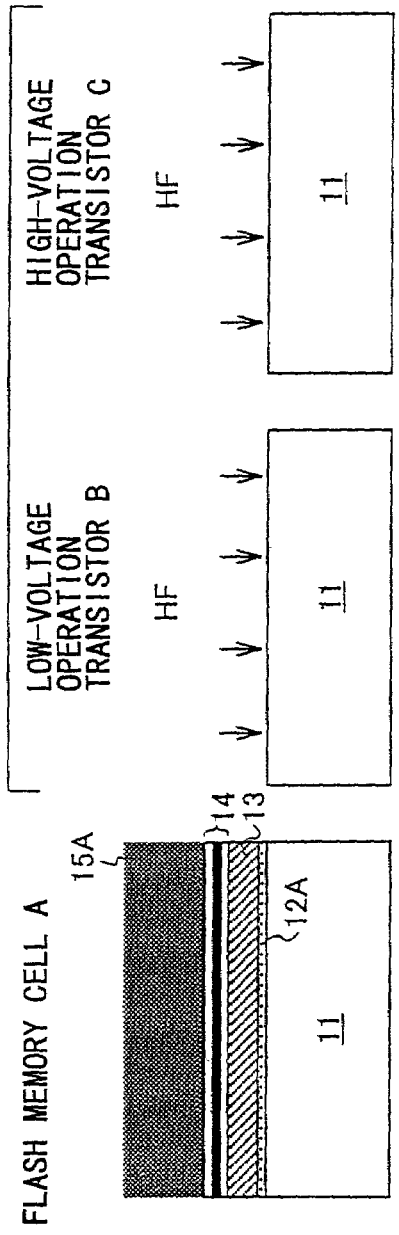
Figure 1D:
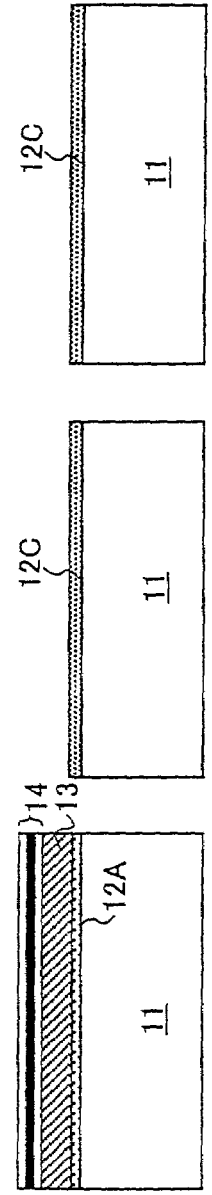
Figure 1E:
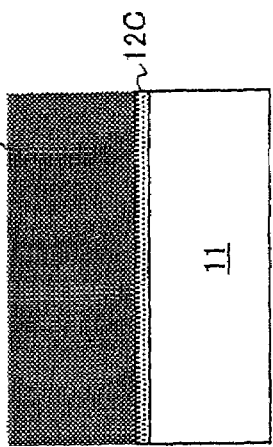
Figure 1F:
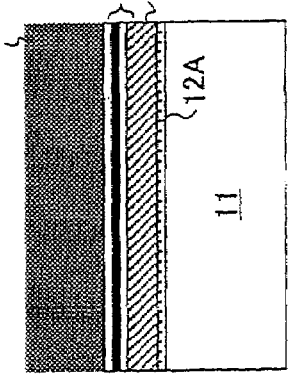

A description will now be given, with reference to the accompanying drawings, of embodiments of the present invention.

First Embodiment

FIGS. 9A through 9I are diagrams showing a production process of a semiconductor integrated circuit device according to a first embodiment of the present invention. In the drawings, the same elements as those previously described are referred to by the same numerals, and a description thereof will be omitted.

In this embodiment, the steps of FIGS. 1A through 1G are first performed, so that a structure corresponding to FIG. 1G is obtained in the step of FIG. 9A. At this point, a silicon-on-insulator (SOI) substrate may replace the Si substrate 11. Further, a tunnel nitride film may replace the tunnel oxide film 12A.

Further, in the step of FIG. 9B, the multilayer gate electrode structure 16F is formed in the flash memory cell region A by performing patterning using the resist pattern 17A described in the step of FIG. 1H. In the step of FIG. 9B, no patterning is performed on the low-voltage operation transistor region B and the high-voltage operation transistor region C that are covered with the resist pattern 17A.

In this embodiment, next, in the step of FIG. 9C, the resist pattern 17A is removed, and the protection insulating film 18 is formed of a thermal oxide film to cover the multilayer gate electrode structure 16F by performing thermal oxidation at temperatures ranging from 800 to 900° C. The same thermal oxide film 18 is also formed on the surface of the amorphous silicon film 16 in each of the regions B and C.

Further, in the step of FIG. 9C, with the multilayer gate electrode structure 16F serving as a self-alignment mask, the diffusion region 11c is formed in the flash memory cell region A by performing ion implantation of As$^+$ (or P$^+$) under the same conditions as in the above-described step of FIG. 1L. The impurity concentration may be the same on the side of the diffusion regions 11a and 11b and the side of the diffusion region 11c. At this point, no ion is injected into the Si substrate 11 in the regions B and C that are covered with the amorphous silicon film 16. A resist pattern that has an opening on the flash memory cell region A may be employed.

In the step of FIG. 9D, by using the resist pattern 17B previously described in the step of FIG. 1I as a mask, patterning is performed on the amorphous silicon film 16 in the regions B and C so that the gate electrodes 16B and 16C are formed in the low-voltage operation transistor region B and the high-voltage operation transistor region C, respectively.

Next, in the step of FIG. 9E, with the resist pattern 19C previously described in the step of FIG. 1M being employed as a mask, the LDD diffusion regions 11d are formed in the Si substrate 11 in the region B by performing ion implantation of an n-type or p-type impurity element therein.

In the step of FIG. 9F, with the resist pattern 19D previously described in the step of FIG. 1N being employed as a mask, the LDD diffusion regions 11e are formed in the Si substrate 11 in the region C by performing ion implantation of an n-type or p-type impurity element therein. In the steps of FIGS. 9E and 9F, the diffusion regions 11d and 11e may be formed under the same ion implantation conditions in the same step.

Figures 1O, 1P:
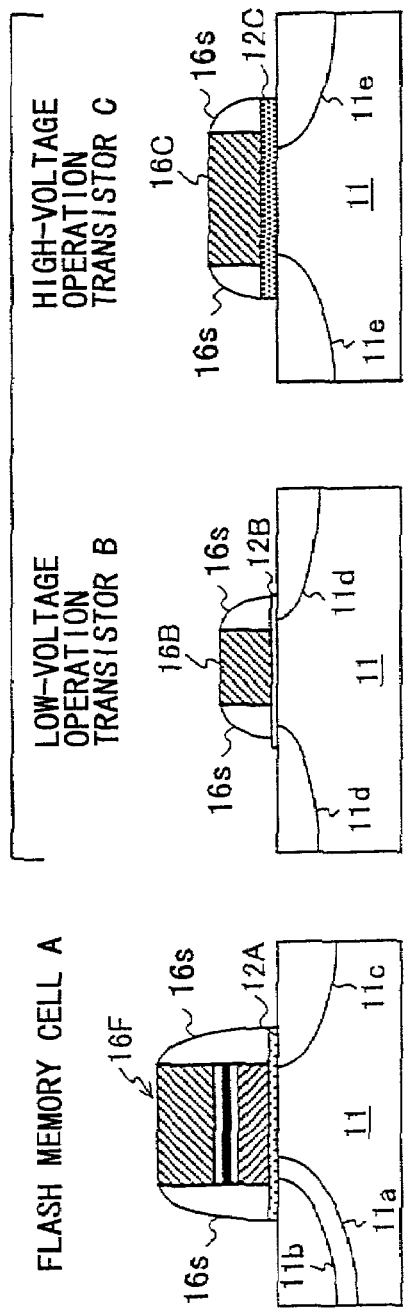
Figure 10A:
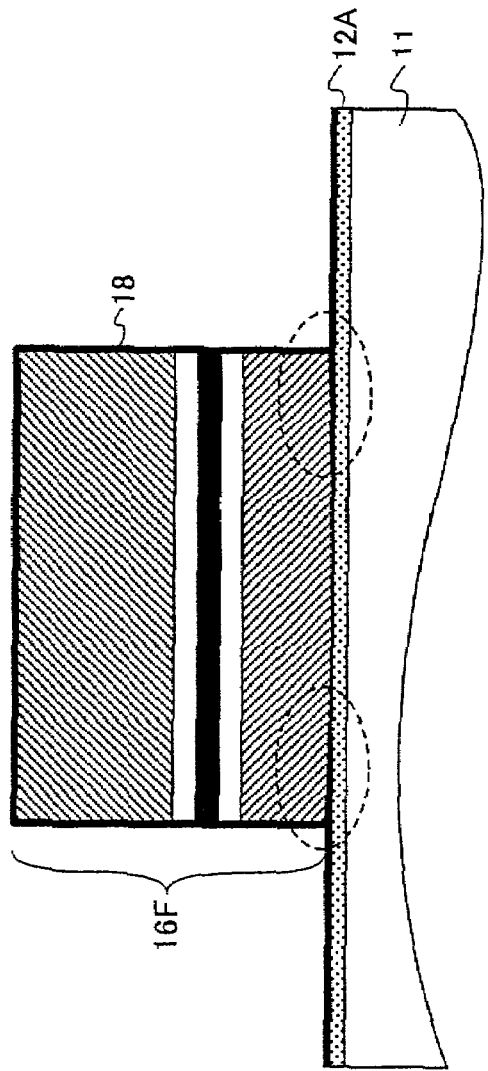
FIGS. 10A and 10B are diagrams for illustrating an effect of the first embodiment.
Figure 10B:
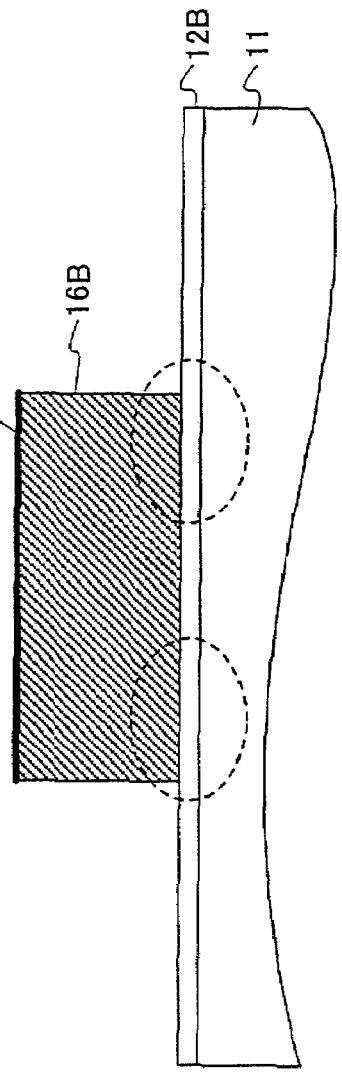

In the step of FIG. 9G, which corresponds to the above-described step of FIG. 10, the sidewall insulating films 16s are formed on each of the multilayer gate electrode structure 16F and the gate electrodes 16B and 16C. In the step of FIG. 9H, which corresponds to the above-described step of FIG. 1P, the flash memory cell region A is covered with the resist pattern 19E. Further, with the gate electrodes 16B and 16C and the sidewall insulating films 16s being used as self-alignment masks, the diffusion regions 11f and 11g are formed in the Si substrate 11 in the regions B and C, respectively, by performing ion implantation of an n-type or p-type impurity element therein.

Figure 1Q:
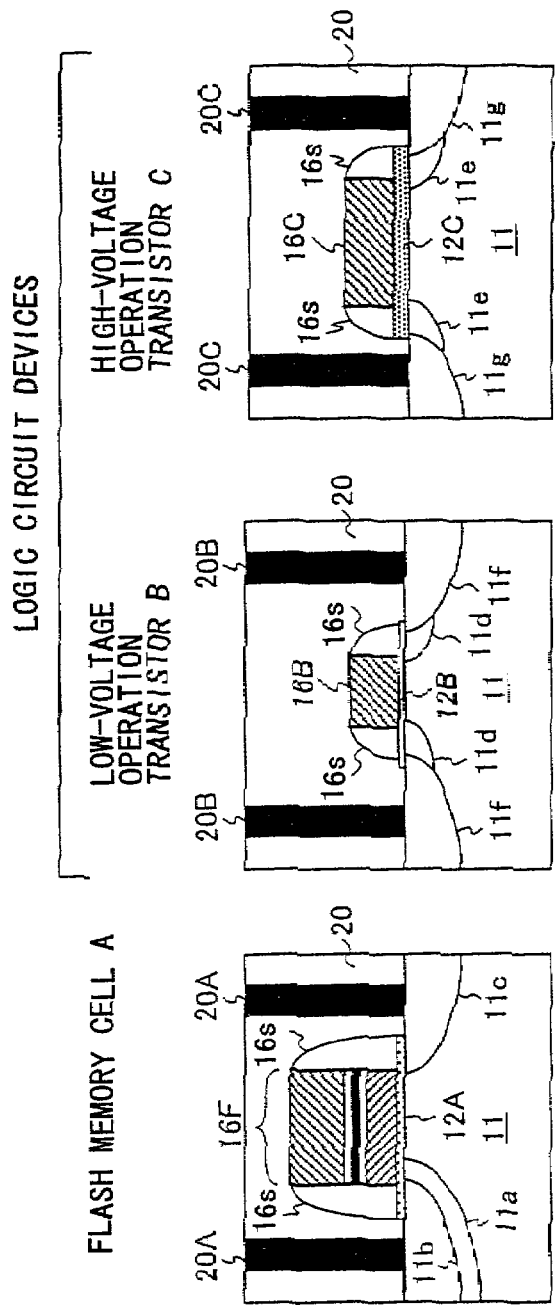
Figure 2A:
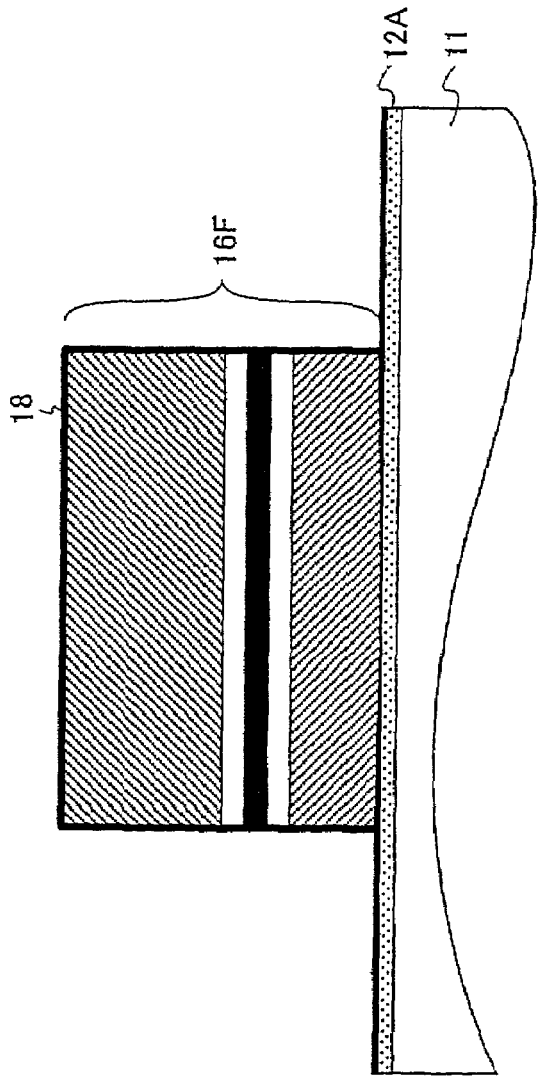
FIGS. 2A and 2B are diagrams for illustrating a disadvantage of the conventional semiconductor integrated circuit device including the flash memory device of the multilayer gate structure.
Figure 2B:
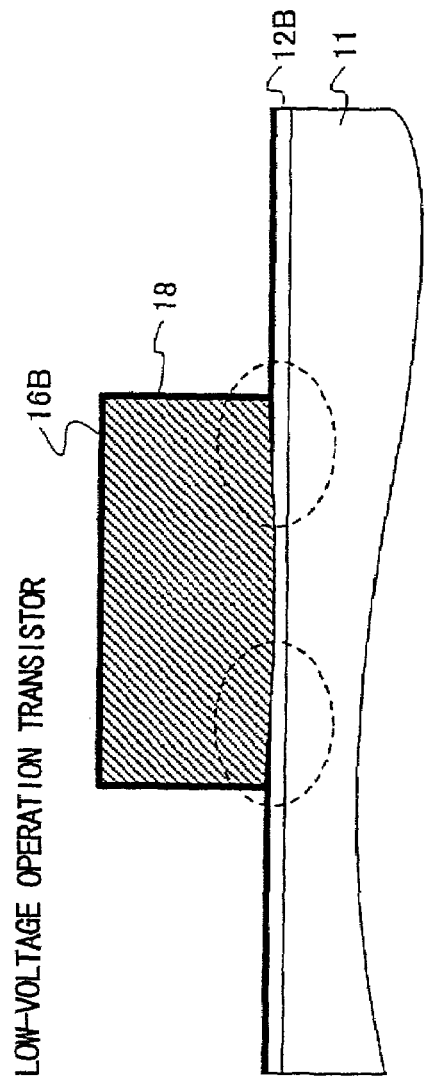
Figure 3A:
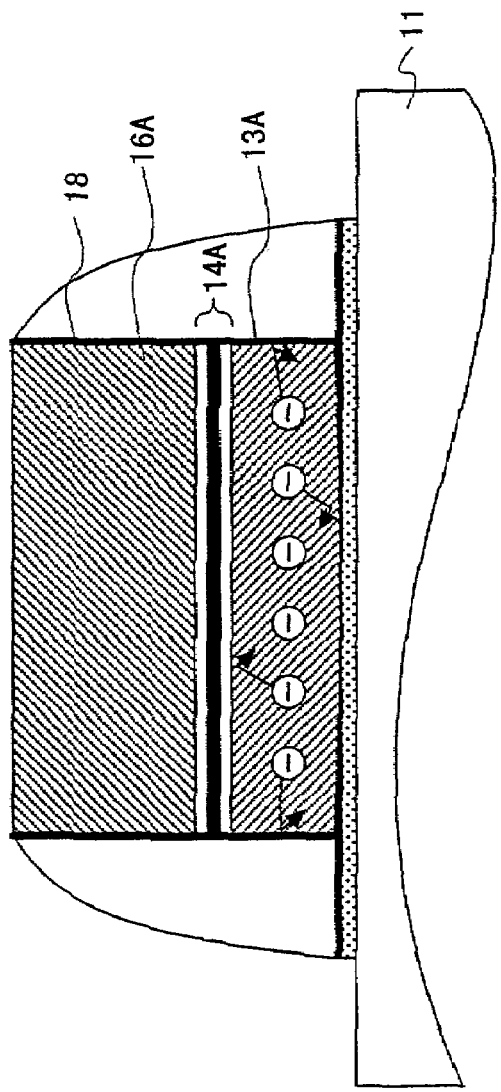
FIGS. 3A and 3B are diagrams for illustrating a role of a protection oxide film employed in the flash memory device of the multilayer gate structure employed in the conventional semiconductor integrated circuit device.
Figure 3B:
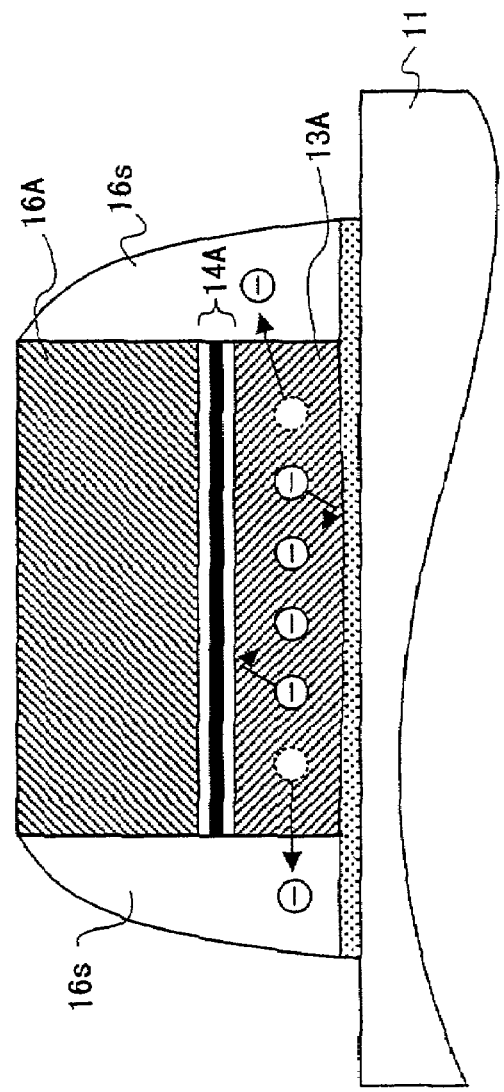
Figure 4:
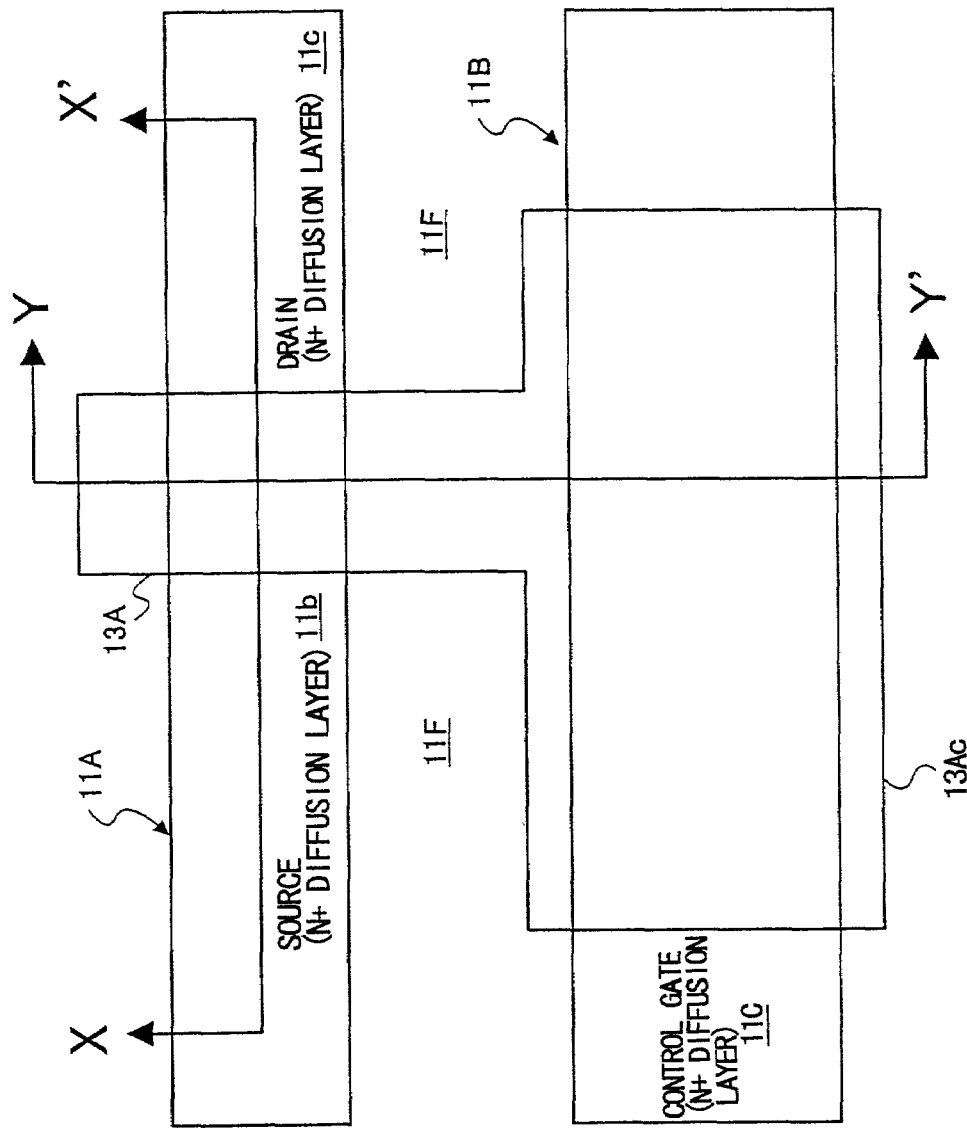
FIG. 4 is a plan view of a flash memory cell of a single-layer gate structure according to related art.
Figure 5A:
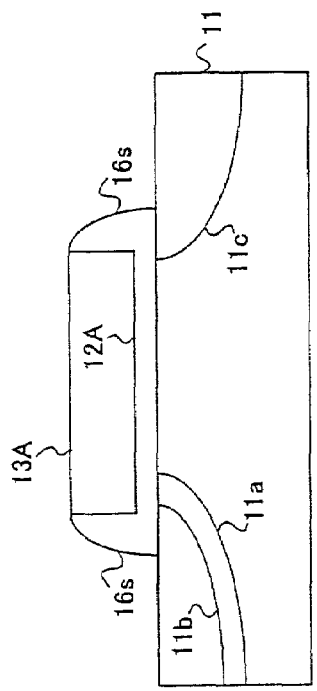
FIGS. 5A and 5B are sectional views of the flash memory cell of FIG. 4.
Figure 5B:
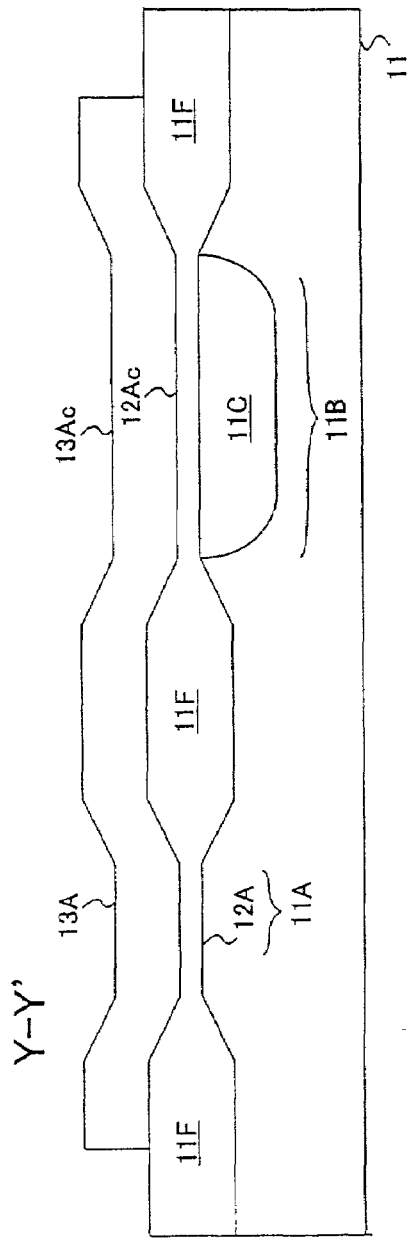

Further, by performing the same step as previously described in FIG. 1Q, a semiconductor integrated circuit device of the structure of FIG. 9I corresponding to FIG. 1Q can be obtained.

In this embodiment, when the protection insulating film 18 is formed by thermal oxidation in the step of FIG. 9C, no patterning has been performed on the amorphous silicon film 16 in the regions B and C. As a result, in the regions B and C, the thermal oxide film 18 is formed on the surface of the amorphous silicon film 16, but is prevented from being formed at an interface between the amorphous silicon film 16 and the gate oxide film 12B. Further, no such thermal oxidation is performed in any step after the patterning step of the gate electrodes 16B and 16C of FIG. 9D. Therefore, although the protection insulating film 18 is formed to cover the multilayer gate electrode structure 16F as shown in FIG. 10A, no thermal oxide film other than the gate oxide film 12B is developed on the bottom of the gate electrode 16B. Therefore, the problem of a change in the threshold characteristic of the low-voltage operation transistor can be avoided.

As shown circled in FIG. 10A, in the step of FIG. 9C, bird's beaks are formed under the floating gate electrode pattern 13A with the formation of the protection insulating film 18. On the other hand, with respect to the MOS transistors of the regions B and C, bird's beaks, if ever formed, are far smaller in thickness and penetration distance than those formed under the floating gate electrode pattern 13A.

Figure 11A:
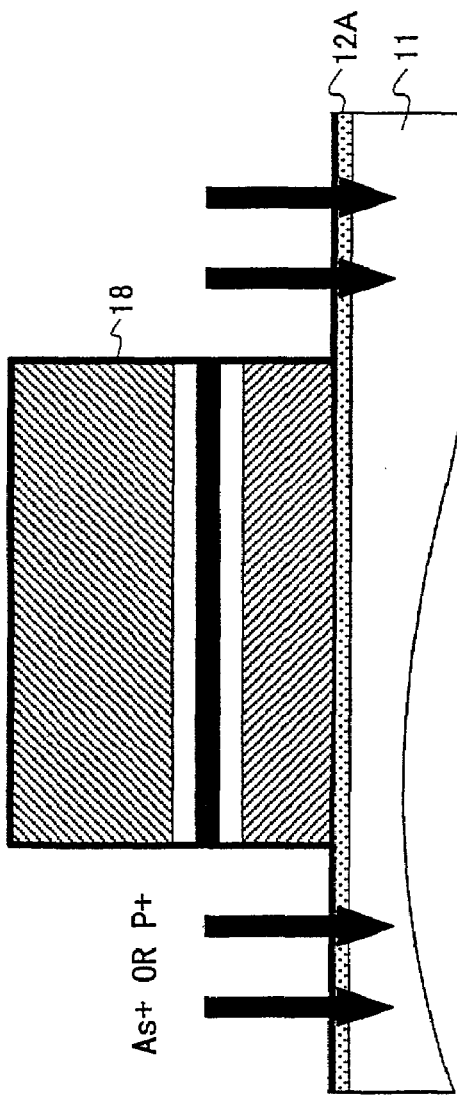
FIGS. 11A and 11B are diagrams for illustrating another effect of the first embodiment.
Figure 11B:
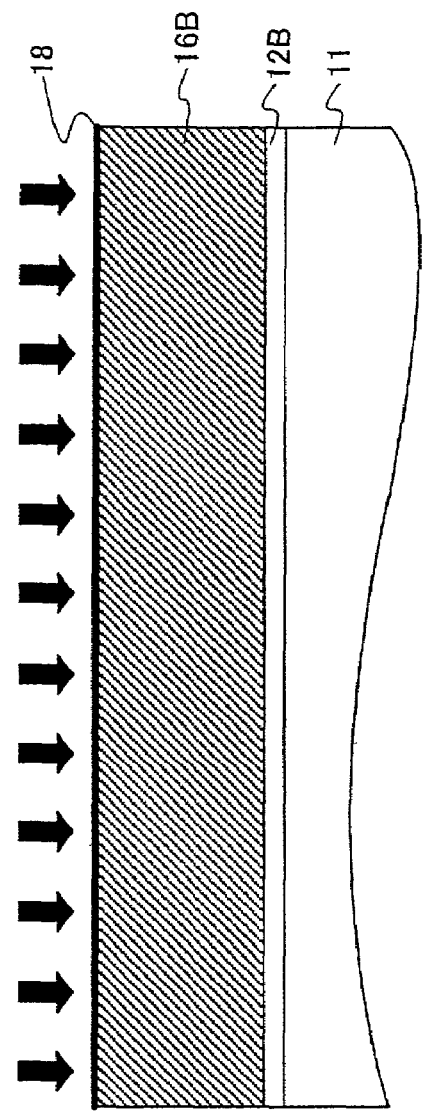

Further in this embodiment, as shown in FIGS. 11A and 11B, in the ion implantation step of FIG. 9C, no resist pattern is required to be provided in the low-voltage operation transistor region B and the high-voltage operation transistor region C since the regions B and C are covered with the amorphous silicon film 16. Consequently, this simplifies the production process of the semiconductor integrated circuit device.

Second Embodiment

FIGS. 12A through 12I are diagrams showing a production method of a semiconductor integrated circuit device including a flash memory device of a single-layer gate electrode structure according to a second embodiment of the present invention. In the drawings, the same elements as those previously described are referred to by the same numerals, and a description thereof will be omitted.

Figures 7A, 7B:
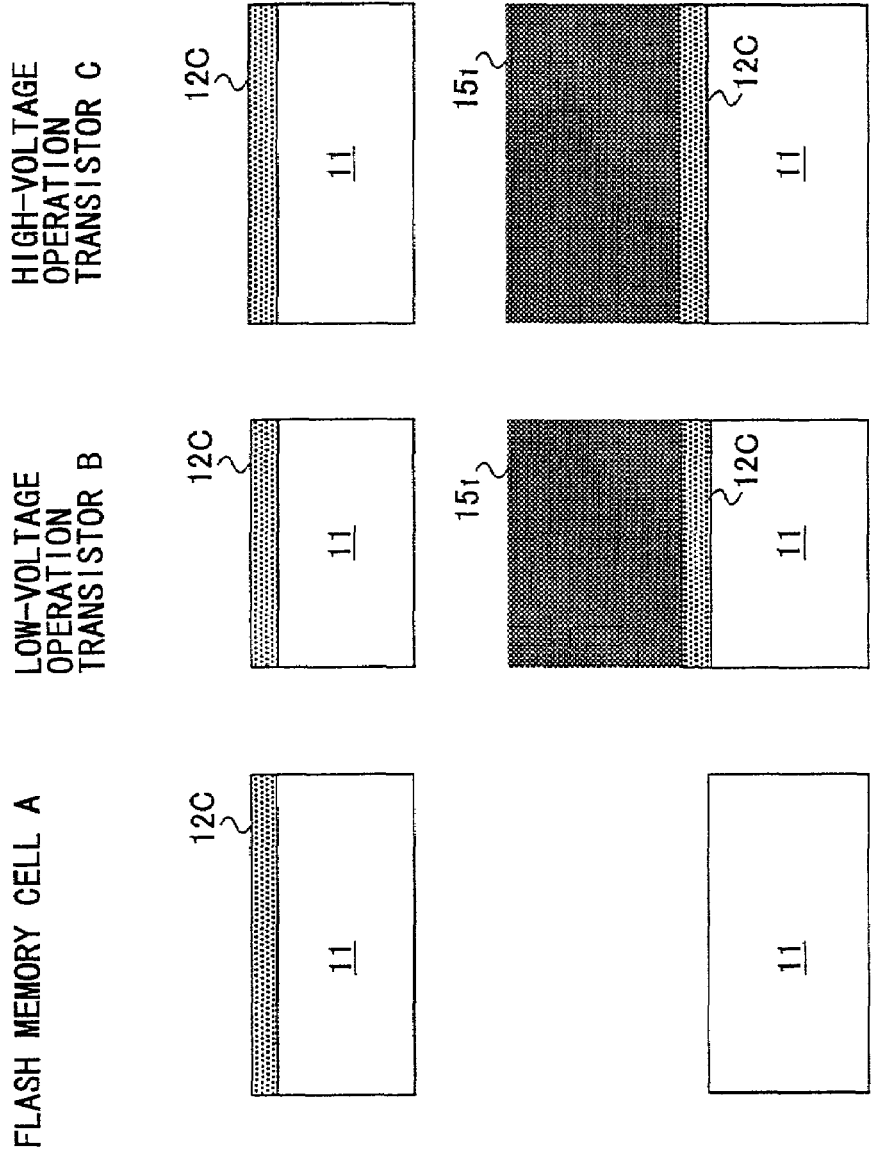
Figures 7C, 7D:
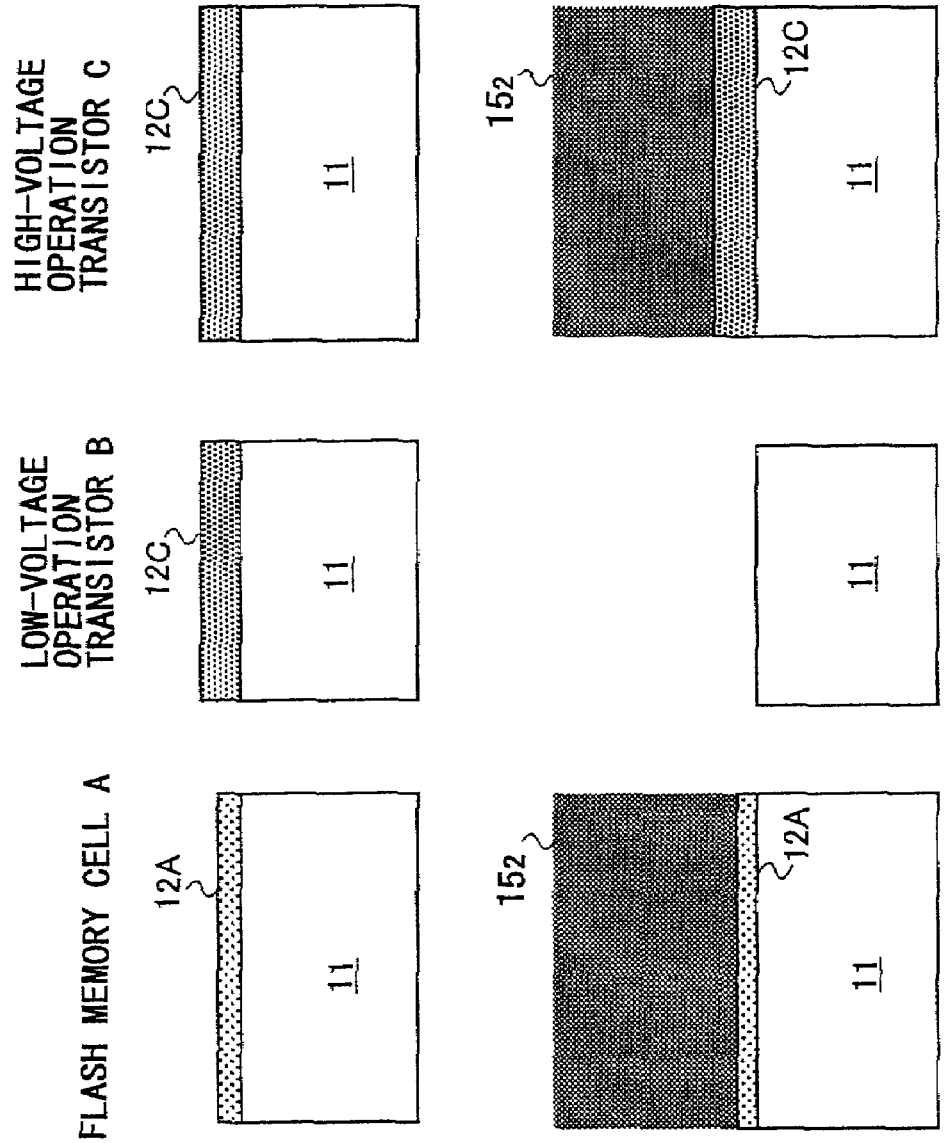
Figures 7E, 7F:
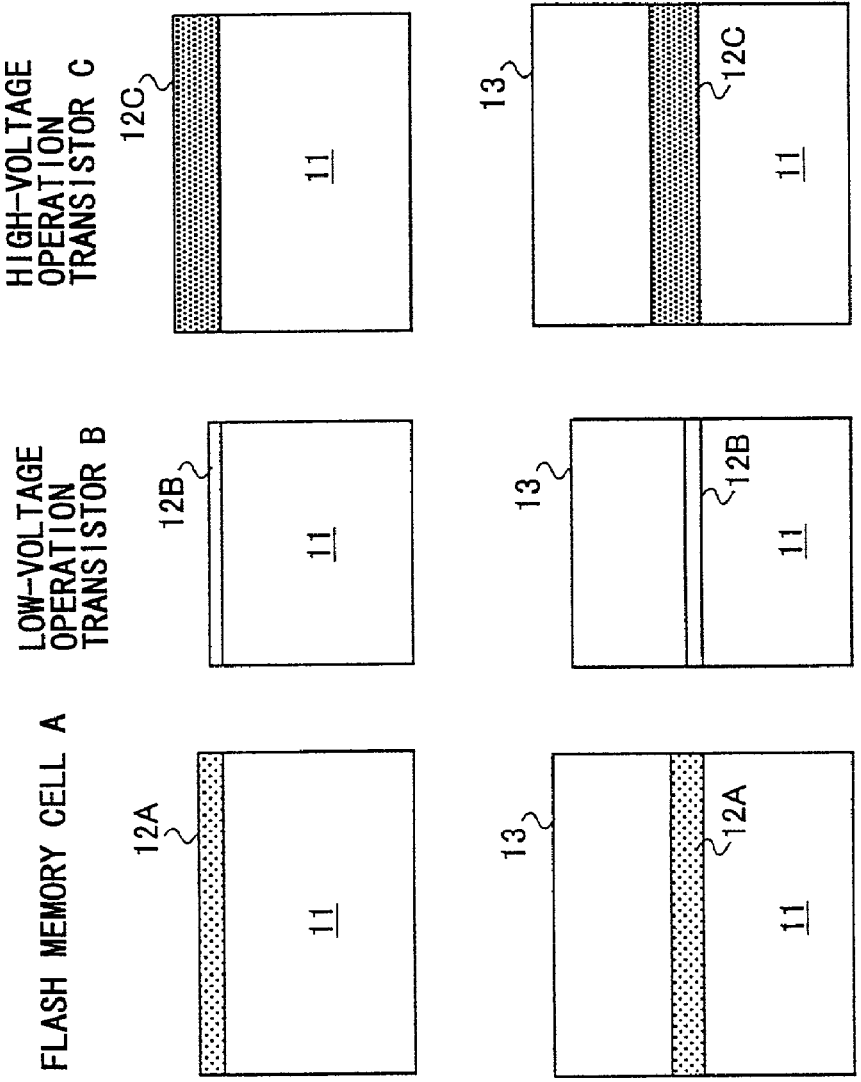
Figures 7G, 7H:
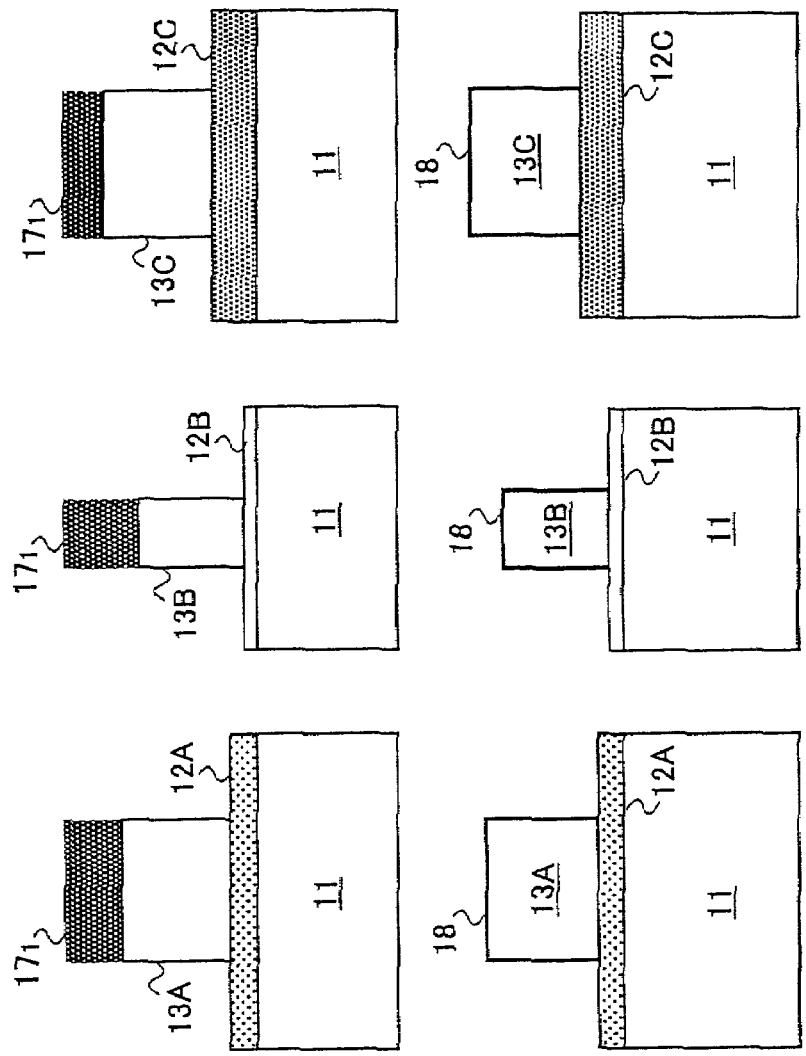
Figures 12A, 12B:
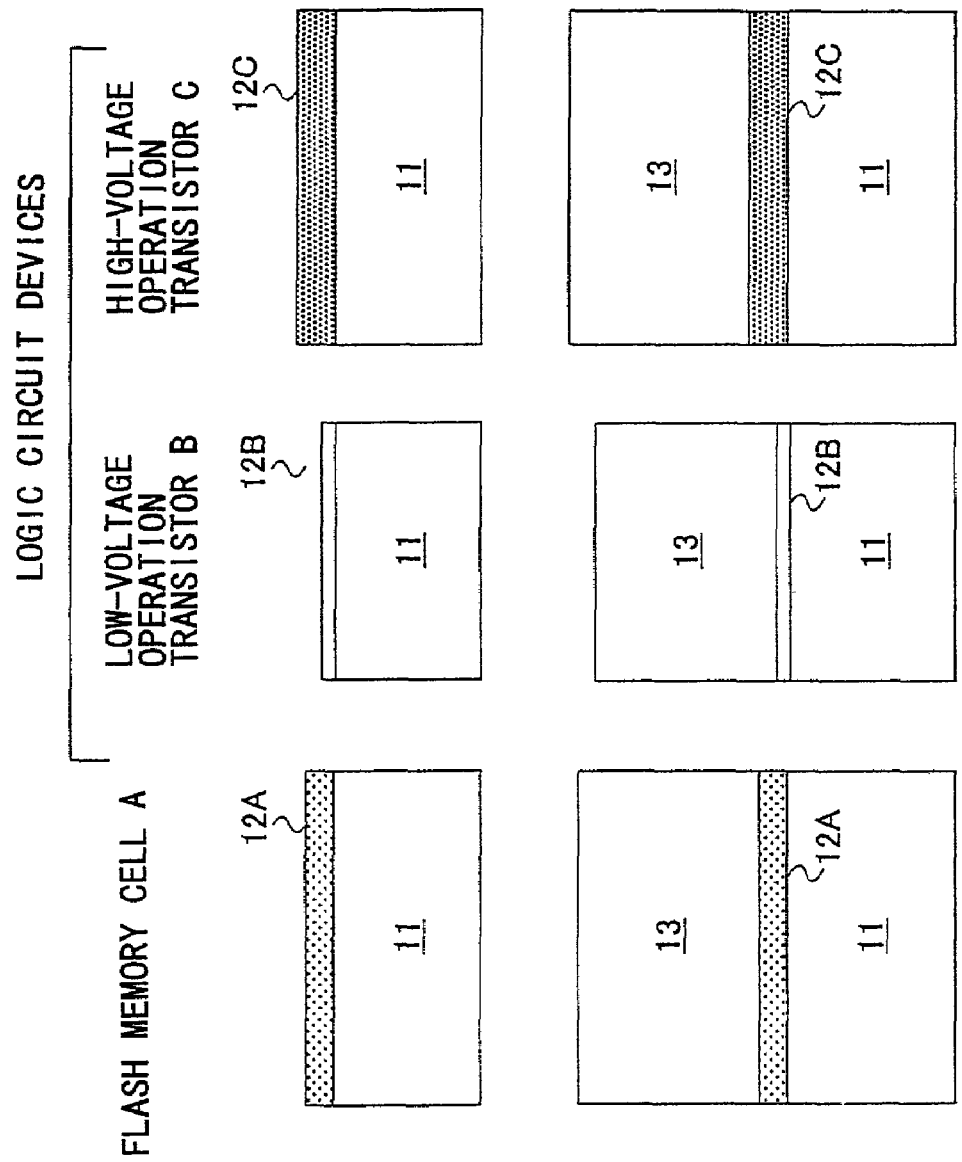

In this embodiment, steps corresponding to those of FIGS. 7A through 7D are first performed, so that a structure corresponding to that of FIG. 7E is obtained in the step of FIG. 12A. In this embodiment, an SOI substrate may also replace the Si substrate 11. Further, a thermal nitride oxide film may replace the tunnel oxide film 12A or the thermal oxide films 12B and 12C.

Next, in the step of FIG. 12B, which corresponds to the step of FIG. 7F, the amorphous silicon film 13 of a thickness of 100 to 300 nm is deposited on the structure of FIG. 12A. The amorphous silicon film 13 may be replaced by a polysilicon film. Further, the amorphous silicon film 13 may be doped with $P^+$. In the step of FIG. 12C, patterning is performed on the amorphous silicon film 13 by using a resist pattern $27_1$ as a mask so that the floating gate electrode pattern 13A is formed. The resist pattern $27_1$ covers the low-voltage operation transistor region B and the high-voltage operation transistor region C. Consequently, no patterning is performed on the amorphous silicon film 13 in the regions B and C in the step of FIG. 12C.

Next, in the step of FIG. 12D, the resist pattern $27_1$ is removed, and the protection insulating film 18 of a thickness of 5 to 10 nm is formed of a thermal oxide film so as to cover the floating gate electrode pattern 13A in the region A by performing thermal oxidation at temperatures ranging from 800 to 900° C. As a result of the thermal oxidation, the thermal oxide film 18 is also formed on the surface of the amorphous silicon film 13 in the regions B and C.

Figure 12E:
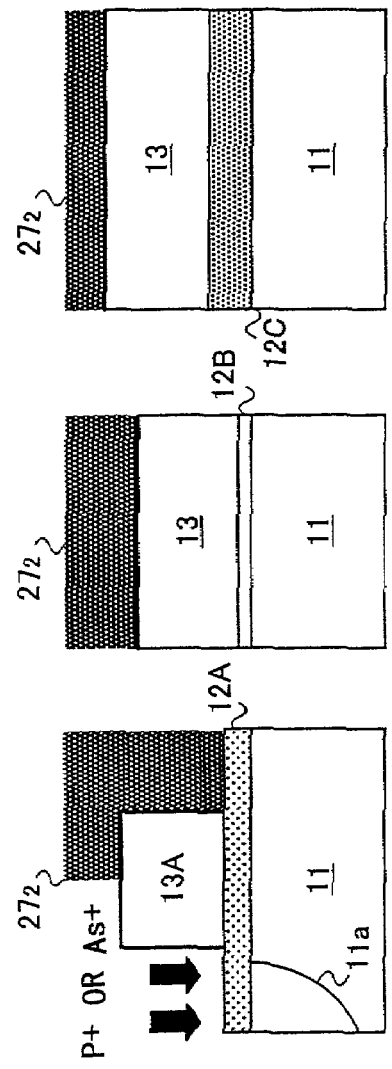

Next, in the step of FIG. 12E, a resist pattern $27_2$ corresponding to the resist pattern $17_2$ in FIG. 7I is formed on the structure of FIG. 12D. With the resist pattern $27_2$ being employed as a mask, ion implantation of $P^+$ (or $As^+$) is performed with a dose of $1 \times 10^{14}$ to $5 \times 10^{14}$ cm$^{-2}$ at accelerating voltages ranging from 30 to 80 keV so that the diffusion region 11a is formed next to the floating gate electrode pattern 13A in the flash memory cell region A. Further in the step of FIG. 12E, after the ion implantation of $P^+$, ion implantation of $As^+$ is performed with a dose of $1 \times 10^{15}$ to $6 \times 10^{15}$ cm$^{-2}$ at accelerating voltages ranging from 30 to 80 keV so that the resistance of the diffusion region 11a is reduced.

Figure 12F:
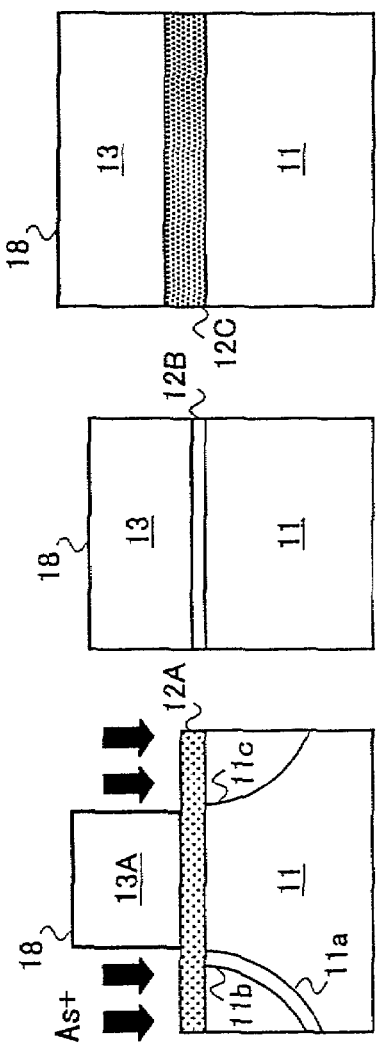

Next, in the step of FIG. 12F, the resist pattern $27_2$ is removed, and with the floating gate electrode pattern 13A being employed as a mask, ion implantation of $As^+$ is performed with a dose of $5 \times 10^{14}$ to $3 \times 10^{15}$ cm$^{-2}$ at accelerating voltages ranging from 20 to 60 keV in the region A so that the diffusion regions 11b and 11c are formed in the Si substrate 11 in the region A. At this point, the step of FIG. 12E is omittable. Further, a resist pattern having an opening only on the flash memory cell region A may be formed alternatively.

Next, in the step of FIG. 12G, a resist pattern $27_3$ is formed on the structure of FIG. 12F. The flash memory cell region A is covered with the resist pattern $27_3$. Then, patterning is performed on the amorphous silicon film 13 with the resist pattern $27_3$ being employed as a mask in the regions B and C so that the gate electrodes 13B and 13C are formed therein.

In the step of FIG. 12H, the resist pattern $27_3$ is removed and a resist pattern $27_4$ covering the flash memory cell region A is formed. With the resist pattern $27_4$ being employed as a mask, an n-type or p-type impurity element is introduced into the Si substrate 11 by ion implantation so that the LDD diffusion regions 11d and 11e are formed in the regions B and C, respectively.

Further, in the step of FIG. 12I, the resist pattern $27_4$ is removed, and a CVD oxide film 16S is deposited. Further, with the CVD oxide film 16S being protected by a resist pattern $27_5$ in the flash memory cell region A, etchback is performed in the regions B and C so that the sidewall oxide films 16s are formed on the sidewalls of each of the gate electrodes 13B and 13C.

Figure 7M:
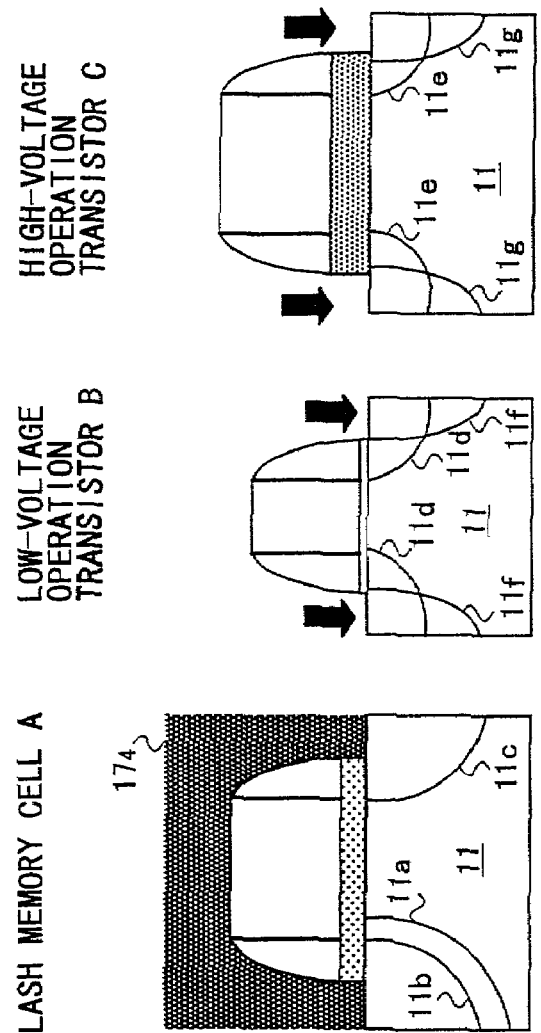
Figure 91:
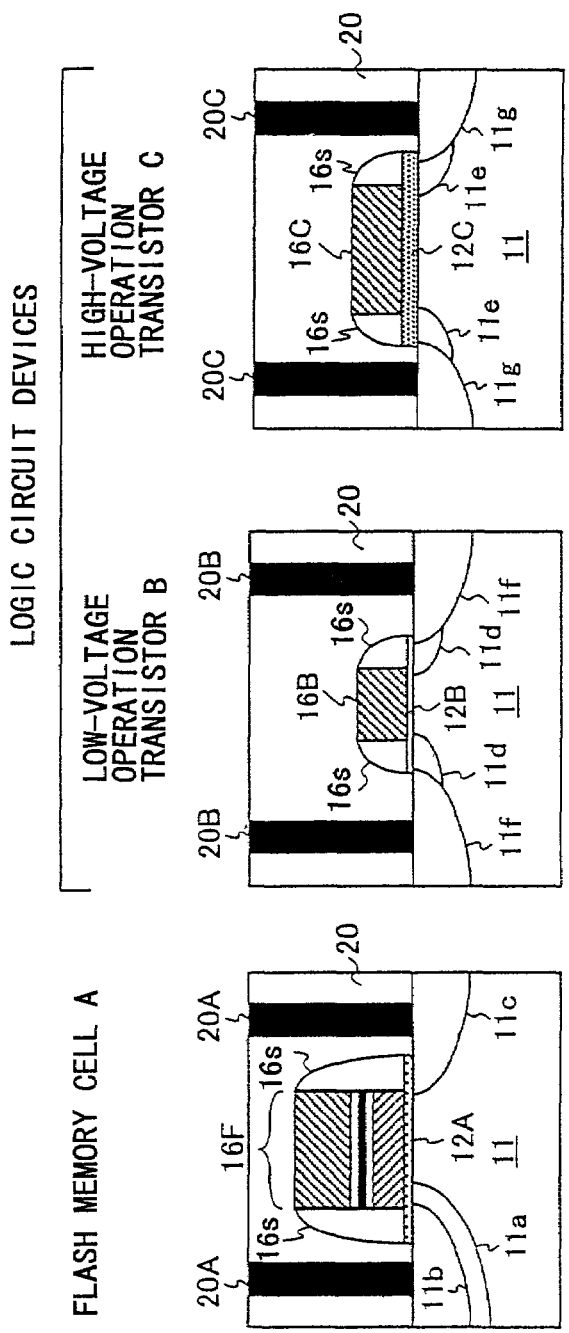

Furthermore, by performing the same ion implantation as in the step of FIG. 7M on the structure of FIG. 12I, the diffusion regions 11f and 11g in the Si substrate 11. A p-type or n-type gate electrode is also formable. A low-resistance silicide film of, for instance, WSi or CoSi may be formed as required on the surface of each of the gate electrodes 13B and 13C and the diffusion regions 11f and 11g by silicide processing.

Figure 13A:
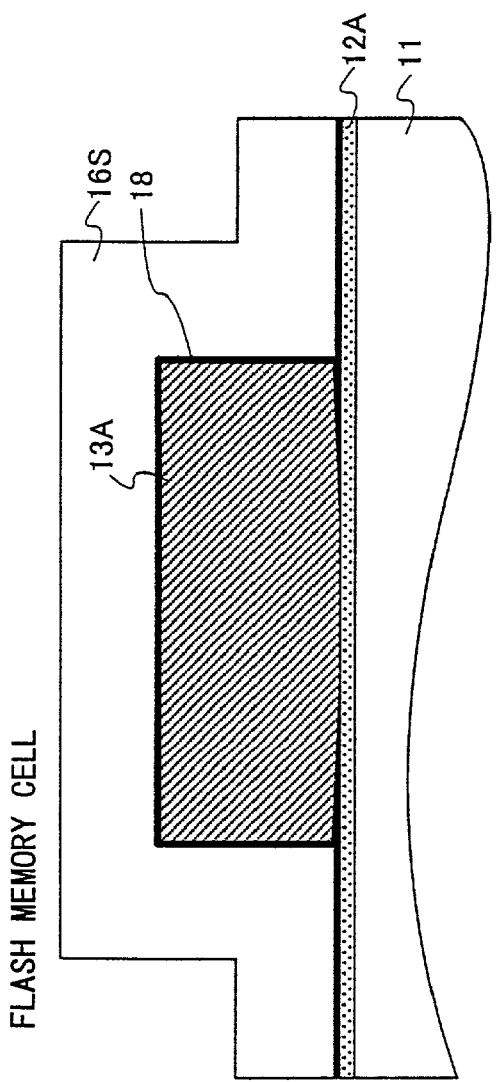
FIGS. 13A and 13B are diagrams for illustrating effects of the second embodiment.
Figure 13B:
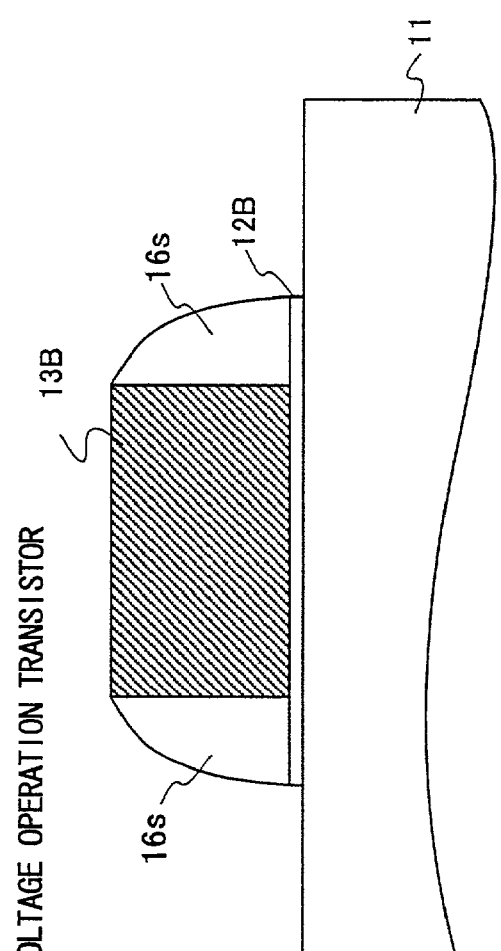

FIGS. 13A and 13B are diagrams showing detailed configurations of the flash memory device and the low-voltage operation transistor formed according to this embodiment.

As shown in FIG. 13A, the floating gate electrode pattern 13A has not only its sidewall faces but also its top surface uniformly covered with the protection insulating film 18 in this embodiment. Therefore, electrons accumulated in the floating gate electrode pattern 13A are stably retained even if the flash memory device is left in a hot environment for a long time.

Further in this embodiment, the amorphous silicon film 13 is not patterned in the regions B and C when the thermal oxidation step of FIG. 12D is performed. Therefore, as shown in FIGS. 13B, no bird' beaks of the thermal oxide film penetrate under the gate electrodes 13B and 13C. This stabilizes the threshold characteristic and the operation characteristic of each MOS transistor formed on the Si substrate 11 on which the flash memory device is formed as well. The improvements in the threshold characteristic and the operation characteristic are remarkable in a low-voltage operation transistor having a short gate length and a thin gate oxide film.

In this embodiment, no resist pattern is required to be formed in the ion implantation step of FIG. 12F, thus simplifying the production process.

In the flash memory device of a multilayer-gate type according to the previous embodiment, the multilayer gate electrode structure 16F may also have its sidewall faces and top surface covered continuously with the protection insulating film 18 in the configuration of FIG. 9I as in that of FIG. 12I.

According to the present invention, a protection oxide film is formed to cover a multilayer gate electrode structure or a floating gate electrode pattern in a flash memory cell region before a gate electrode is patterned in a first or second device region. The protection oxide film prevents a bird' beak structure from being formed to penetrate into the gate electrode in the device region. Therefore, the problem of a change in the threshold characteristic of a semiconductor device in the device region can be avoided. Further, according to the present invention, when diffusion regions are formed in the flash memory cell region by ion implantation, the device region is covered with an amorphous silicon film. By using the amorphous silicon film as a mask, a resist process may be omitted, thus simplifying the production process.

The present invention is not limited to the specifically disclosed embodiments, but variations and modifications may be made without departing from the scope of the present invention.

What is claimed is:

1. A semiconductor integrated circuit device comprising:
   a substrate;
   a nonvolatile memory device formed in a memory cell region of said substrate and having a multilayer gate electrode structure comprising a tunnel insulating film covering said substrate and a floating gate electrode formed on the tunnel insulating film and having sidewall surfaces covered with a protection insulating film formed of a thermal oxide film;
   a semiconductor device formed in a device region of said substrate, the semiconductor device comprising a gate insulating film covering said substrate and gate electrode formed on the gate insulating film;
   wherein a bird's beak structure is formed of a thermal oxide film at an interface of the tunnel insulating film and the floating gate electrode, the bird's beak structure penetrating into the floating gate electrode along the interface from the sidewall faces of the floating gate electrode;
   the gate insulating film is interposed between said substrate and the gate electrode to have a uniform thickness at the region under the entire gate electrode;
   wherein the bird's beak structure is the same thermal oxide film as the protective insulating film;
   wherein the protection insulating film continuously covers sidewall faces and a top surface of the multilayer gate electrode structure; wherein the protection insulating film covers the multilayer gate electrode uniformly and sidewalls are formed over the protection insulating film, said sidewalls covering the entire side surface of the multilayer gate electrode structure;
   and the multilayer gate electrode structure, including a control gate has a substantially uniform width.

2. The semiconductor integrated circuit device as claimed in claim 1, wherein the multilayer gate electrode structure further comprises an insulating film formed on the floating gate electrode and a control gate electrode formed on the insulating film.

3. The semiconductor integrated circuit device as claimed in claim 2, wherein each of the gate electrode and the control gate electrode comprises a polycide or polymetal structure including a silicon film doped with an n-type or p-type dopant.

4. The semiconductor integrated circuit device as claimed in claim 1, wherein the thermal oxide film forming the protection insulating film connects to the bird's beak structure.

5. The semiconductor integrated circuit device as claimed in claim 1, wherein a silicon-on-insulator substrate is employed as said substrate.

6. The semiconductor integrate circuit device as claimed in claim 1, wherein the tunnel insulating film is a tunnel oxide film.

7. The semiconductor integrate circuit device as claimed in claim 1, wherein the tunnel insulating film is a tunnel nitride film.

8. A semiconductor integrated circuit device comprising:
   a substrate;
   a nonvolatile memory device formed in a memory cell region of said substrate,
   the nonvolatile memory device comprising:
   a first active region covered with a tunnel insulating film;
   a second active region formed next to the first active region and covered with an insulating film;
   a control gate formed of an embedded diffusion region formed in the first active region;
   a first gate electrode extending on the tunnel insulating film in the first active region and forming a bridge between the first and second active regions to be capacitive-coupled via the insulating film to the embedded diffusion region in the first active region, the first gate electrode having sidewall faces thereof covered with a protection insulating film formed of a thermal oxide film;
   a diffusion region formed on each of sides of the first gate electrode in the first active region; and
   a semiconductor device formed in a device region of said substrate, the semiconductor device comprising a gate insulating film covering said substrate and a second gate electrode formed on the gate insulating film,
   wherein a bird's beak structure is formed of a thermal oxide film at an interface of the tunnel insulating film and the first gate electrode, the bird's beak structure penetrating into the first gate electrode along the interface from the sidewall faces of the first gate electrode;

the gate insulating film is interposed between said substrate and the second gate electrode to have a uniform thickness at the region under the entire gate electrode; and wherein the bird's beak structure is the same thermal oxide film as the protective insulating film;

wherein the protection insulating film continuously covers a top surface of the first gate electrode; wherein the protection insulating film covers the first gate electrode uniformly and sidewalls are formed over the protection insulating film, said sidewalls covering the entire side surface of the first gate electrode;

and the first gate electrode has a substantially uniform width.

9. The semiconductor integrated circuit device as claimed in claim 8, wherein the thermal oxide film forming the protection insulating film is connected to the bird's beak structure.

10. The semiconductor integrated circuit device as claimed in claim 8, wherein the second gate electrode comprises a polycide or polymetal structure including a silicon film doped with an n-type or p-type dopant.

11. The semiconductor integrated circuit device as claimed in claim 8, wherein a silicon-on-insulator substrate is employed as said substrate.

12. The semiconductor integrated circuit device as claimed in claim 8, wherein the tunnel insulating film is a tunnel oxide film.

13. The semiconductor integrated circuit device as claimed in claim 8, wherein the tunnel insulating film is a thermal nitride oxide film.

14. A semiconductor integrated circuit device comprising:
a substrate;
a nonvolatile memory device formed in a memory cell region of said substrate and having a multilayer gate electrode structure comprising a tunnel insulating film covering said substrate and a floating gate electrode formed on the tunnel insulating film and having sidewall surfaces covered with a protection insulating film formed of a thermal oxide film; and a semiconductor device formed in a device region of said substrate, the semiconductor device comprising a gate insulating film covering said substrate and gate electrode formed on the gate insulating film, wherein a bird's beak structure is formed of a thermal oxide film at an interface of the tunnel insulating film and the floating gate electrode, the bird's beak structure penetrating into the floating gate electrode along the interface from the sidewall faces of the floating gate electrode; the gate insulating film is interposed between said substrate and the gate electrode to have a uniform thickness at the region under the entire gate electrode;

the multilayer gate electrode structure further comprises an insulating film formed on the floating gate electrode and a control gate electrode formed on the insulating film;

each of the gate electrode and the control gate electrode comprises a polycide or polymetal structure including a silicon film doped with an n-type or p-type dopant;

wherein the bird's beak structure is the same thermal oxide film as the protective insulating film;

wherein the protection insulating film continuously covers a top surface of the floating gate electrode; wherein the protection insulating film covers the floating gate electrode uniformly and sidewalls are formed over the protection insulating film, said sidewalls covering the entire side surface of the multilayer gate electrode structure;

and the multilayer gate electrode structure has a substantially uniform width.

* * * * *